United States Patent
Cooper

(10) Patent No.: US 6,359,548 B1
(45) Date of Patent: Mar. 19, 2002

(54) DATA COMPRESSION AND DECOMPRESSION METHOD AND APPARATUS WITH EMBEDDED FILTERING OF INFREQUENTLY ENCOUNTERED STRINGS

(75) Inventor: Albert B. Cooper, New York, NY (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/688,604

(22) Filed: Oct. 16, 2000

(51) Int. Cl.[7] .............................. H03M 7/00; H03M 7/34
(52) U.S. Cl. .............................. 340/50; 341/51; 341/106
(58) Field of Search .............................. 341/50, 51, 63, 341/87, 95, 106

(56) References Cited

U.S. PATENT DOCUMENTS

| | | | | |
|---|---|---|---|---|
| 4,558,302 A | | 12/1985 | Welch | ......................... 340/347 |
| 5,049,881 A | * | 9/1991 | Gibson et al. | ................. 341/51 |
| 5,151,697 A | * | 9/1992 | Bunton | ......................... 341/51 |
| 5,373,290 A | * | 12/1994 | Lempel et al. | ................. 341/51 |
| 5,389,922 A | * | 2/1995 | Seroussi et al. | ............... 341/51 |
| 5,455,576 A | * | 10/1995 | Clark, II et al. | ............... 341/50 |
| 5,455,943 A | * | 10/1995 | Chambers, IV | .............. 341/51 |
| 5,805,086 A | * | 9/1998 | Brown et al. | ................. 341/51 |
| 5,951,623 A | | 9/1999 | Reynar et al. | .............. 708/203 |

* cited by examiner

*Primary Examiner*—Peguy Jeanpierre
*Assistant Examiner*—Jean Bruner Jeanglaude
(74) *Attorney, Agent, or Firm*—Albert B. Cooper; Mark T. Starr

(57) ABSTRACT

A data compression and decompression system based on the LZW data compression and decompression methodology that includes exclusion tables storing strings that are infrequently encountered. If an extended string formed for updating the compressor and decompressor dictionaries is included in the exclusion tables, the extended string is not stored and the code counter for assigning codes to dictionary strings is not advanced. In this manner, dictionary codes are not usurped by infrequently encountered strings.

47 Claims, 14 Drawing Sheets

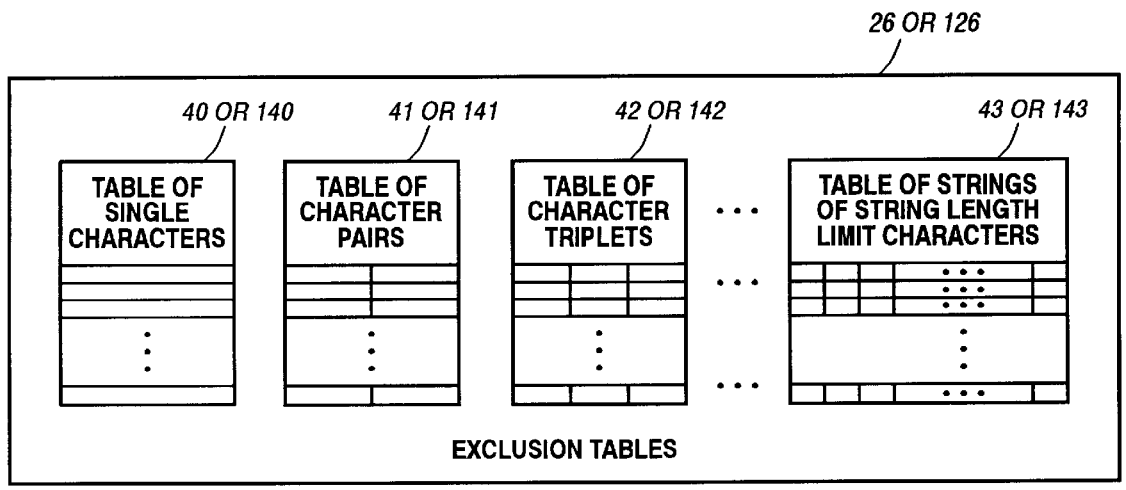
Figure 2
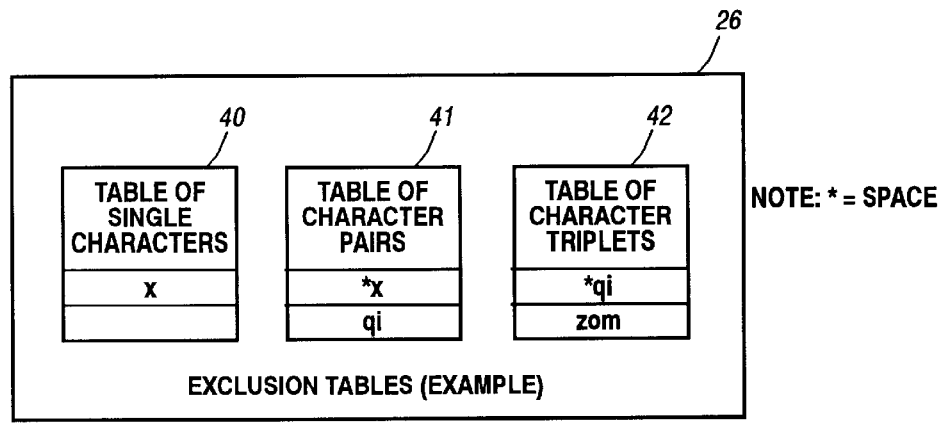
Figure 5
| FIGURE 6A |
| FIGURE 6B |
| FIGURE 6C |
Figure 6
| FIGURE 12A |
| FIGURE 12B |
Figure 12

*COMPRESSOR*

INPUT DATA CHARACTER STREAM $a_1\ b_1\ a_2\ b_2\ a_3\ b_3\ a_4\ b_4\ e_1\ x_1\ *_1\ x_2\ a_5\ b_5\ a_6\ q_1\ u_1\ *_2\ q_2\ u_2\ a_7\ *_3$
$q_3\ i_1\ b_6\ a_8\ b_7\ q_4\ i_2\ z_1\ a_9\ z_2\ o_1\ z_3\ o_2\ m_1\ *_4\ z_4\ o_3\ m_2\ *_5\ d_1$

NOTE: * = SPACE

| ACT-IONS | CURR MATCH | CURR CHAR | TEST REGISTER | CHAR CNTR | CODE CNTR | DICT CODE | DICT CHAR | OUT PUT | BLOCKS OF FIG. 4 |
|---|---|---|---|---|---|---|---|---|---|
| 1 | $a_1$ | | $a_1$ | 1 | 258 | | | | 70-74,76,77 |
| 2 | | $b_1$ | $a_1b_1$ | 2 | | $a_1$ | $b_1$ | $a_1$ | 80-83,85-87,90 |
| 3 | $b_1$ | | $b_1$ | 1 | 259 | | | | 91-95,74,76,77 |
| 4 | | $a_2$ | $b_1a_2$ | 2 | | $b_1$ | $a_2$ | $b_1$ | 80-83,85-87,90 |
| 5 | $a_2$ | | $a_2$ | 1 | 260 | | | | 91-95,74,76,77 |
| 6 | | $b_2$ | $a_2b_2$ | 2 | | | | | 80-83 |
| 7 | 258 | $a_3$ | $a_2b_2a_3$ | 3 | | 258 | $a_3$ | 258 | 84,80-83,85-87,90 |
| 8 | $a_3$ | | $a_3$ | 1 | 261 | | | | 91-95,74,76,77 |
| 9 | | $b_3$ | $a_3b_3$ | 2 | | | | | 80-83 |
| 10 | 258 | $a_4$ | $a_3b_3a_4$ | 3 | | | | | 84,80-83 |
| 11 | 260 | $b_4$ | $a_3b_3a_4b_4$ | 4 | | | | 260 | 84,80-83,85,86 |
| 12 | $b_4$ | | $b_4$ | 1 | | | | | 94,95,74,76,77 |
| 13 | | $e_1$ | $b_4e_1$ | 2 | | $b_4$ | $e_1$ | $b_4$ | 80-83,85-87,90 |
| 14 | $e_1$ | | $e_1$ | 1 | 262 | | | | 91-95,74,76,77 |
| 15 | | $x_1$ | $e_1x_1$ | 2 | | $e_1$ | $x_1$ | $e_1$ | 80-83,85-87,90 |
| 16 | $x_1$ | | | | 263 | | | $x_1$ | 91-95,74,75 |
| 17 | $*_1$ | | $*_1$ | 1 | | | | | 73,74,76,77 |
| 18 | | $x_2$ | $*_1x_2$ | 2 | | | | $*_1$ | 80-83,85-87 |
| 19 | $x_2$ | | | | | | | $x_2$ | 94,95,74,75 |
| 20 | $a_5$ | | $a_5$ | 1 | | | | | 73,74,76,77 |
| 21 | | $b_5$ | $a_5b_5$ | 2 | | | | | 80-83 |
| 22 | 258 | $a_6$ | $a_5b_5a_6$ | 3 | | | | | 84,80-83 |

*Figure 6A*

| 23 | 260 | $q_1$ | $a_5b_5a_6q_1$ | 4 | | | 260 | 84,80-83,85,86 |
|---|---|---|---|---|---|---|---|---|
| 24 | $q_1$ | | $q_1$ | 1 | | | | 94,95,74,76,77 |
| 25 | | $u_1$ | $q_1u_1$ | 2 | $q_1$ | $u_1$ | $q_1$ | 80-83,85-87,90 |
| 26 | $u_1$ | | $u_1$ | 1 | 264 | | | 91-95,74,76,77 |
| 27 | | $*_2$ | $u_1*_2$ | 2 | $u_1$ | $*_2$ | $u_1$ | 80-83,85-87,90 |
| 28 | $*_2$ | | $*_2$ | 1 | 265 | | | 91-95,74,76,77 |
| 29 | | $q_2$ | $*_2q_2$ | 2 | $*_2$ | $q_2$ | $*_2$ | 80-83,85-87,90 |
| 30 | $q_2$ | | $q_2$ | 1 | 266 | | | 91-95,74,76,77 |
| 31 | | $u_2$ | $q_2u_2$ | 2 | | | | 80-83 |
| 32 | 263 | $a_7$ | $q_2u_2a_7$ | 3 | 263 | $a_7$ | 263 | 84,80-83,85-87,90 |
| 33 | $a_7$ | | $a_7$ | 1 | 267 | | | 91-95,74,76,77 |
| 34 | | $*_3$ | $a_7*_3$ | 2 | $a_7$ | $*_3$ | $a_7$ | 80-83,85-87,90 |
| 35 | $*_3$ | | $*_3$ | 1 | 268 | | | 91-95,74,76,77 |
| 36 | | $q_3$ | $*_3q_3$ | 2 | | | | 80-83 |
| 37 | 265 | $i_1$ | $*_3q_3i_1$ | 3 | | | 265 | 84,80-83,85-87 |
| 38 | $i_1$ | | $i_1$ | 1 | | | | 94,95,74,76,77 |
| 39 | | $b_6$ | $i_1b_6$ | 2 | $i_1$ | $b_6$ | $i_1$ | 80-83,85-87,90 |
| 40 | $b_6$ | | $b_6$ | 1 | 269 | | | 91-95,74,76,77 |
| 41 | | $a_8$ | $b_6a_8$ | 2 | | | | 80-83 |
| 42 | 259 | $b_7$ | $b_6a_8b_7$ | 3 | 259 | $b_7$ | 259 | 84,80-83,85-87,90 |
| 43 | $b_7$ | | $b_7$ | 1 | 270 | | | 91-95,74,76,77 |
| 44 | | $q_4$ | $b_7q_4$ | 2 | $b_7$ | $q_4$ | $b_7$ | 80-83,85-87,90 |
| 45 | $q_4$ | | $q_4$ | 1 | 271 | | | 91-95,74,76,77 |
| 46 | | $i_2$ | $q_4i_2$ | 2 | | | $q_4$ | 80-83,85-87 |
| 47 | $i_2$ | | $i_2$ | 1 | | | | 94,95,74,76,77 |

*Figure 6B*

| 48 | | $z_1$ | $i_2z_1$ | 2 | | $i_2$ | $z_1$ | $i_2$ | 80-83,85-87,90 |
|---|---|---|---|---|---|---|---|---|---|
| 49 | $z_1$ | | $z_1$ | 1 | 272 | | | | 91-95,74,76,77 |
| 50 | | $a_9$ | $z_1a_9$ | 2 | | $z_1$ | $a_9$ | $z_1$ | 80-83,85-87,90 |
| 51 | $a_9$ | | $a_9$ | 1 | 273 | | | | 91-95,74,76,77 |
| 52 | | $z_2$ | $a_9z_2$ | 2 | | $a_9$ | $z_2$ | $a_9$ | 80-83,85-87,90 |
| 53 | $z_2$ | | $z_2$ | 1 | 274 | | | | 91-95,74,76,77 |
| 54 | | $o_1$ | $z_2o_1$ | 2 | | $z_2$ | $o_1$ | $z_2$ | 80-83,85-87,90 |
| 55 | $o_1$ | | $o_1$ | 1 | 275 | | | | 91-95,74,76,77 |
| 56 | | $z_3$ | $o_1z_3$ | 2 | | $o_1$ | $z_3$ | $o_1$ | 80-83,85-87,90 |
| 57 | $z_3$ | | $z_3$ | 1 | 276 | | | | 91-95,74,76,77 |
| 58 | | $o_2$ | $z_3o_2$ | 2 | | | | | 80-83 |
| 59 | 274 | $m_1$ | $z_3o_2m_1$ | 3 | | | | 274 | 84,80-83,85-87 |
| 60 | $m_1$ | | $m_1$ | 1 | | | | | 94,95,74,76,77 |
| 61 | | $*_4$ | $m_1*_4$ | 2 | | $m_1$ | $*_4$ | $m_1$ | 80-83,85-87,90 |
| 62 | $*_4$ | | $*_4$ | 1 | 277 | | | | 91-95,74,76,77 |
| 63 | | $z_4$ | $*_4z_4$ | 2 | | $*_4$ | $z_4$ | $*_4$ | 80-83,85-87,90 |
| 64 | $z_4$ | | $z_4$ | 1 | 278 | | | | 91-95,74,76,77 |
| 65 | | $o_3$ | $z_4o_3$ | 2 | | | | | 80-83 |
| 66 | 274 | $m_2$ | $z_4o_3m_2$ | 3 | | | | 274 | 84,80-83,85-87 |
| 67 | $m_2$ | | $m_2$ | 1 | | | | | 94,95,74,76,77 |
| 68 | | $*_5$ | $m_2*_5$ | 2 | | | | | 80-83 |
| 69 | 276 | $d_1$ | $m_2*_5d_1$ | 3 | | 276 | $d_1$ | 276 | 84,80-83,85-87,90 |
| 70 | $d_1$ | | $d_1$ | 1 | 279 | | | $d_1$ | 91-95,74,76,77 |

*Figure 6C*

*DECOMPRESSOR*

CHARACTER PROCESSING

*STRING PROCESSING*

EXCEPTION CASE PROCESSING

INPUT COMPRESSED CODE STREAM $a_1\ b_1\ 258\ 260\ b_2\ e_1\ x_1\ *_1\ x_2\ 260\ q_1\ u_1\ *_2\ 263\ a_2\ 265\ i_1\ 259\ b_3\ q_2\ i_2\ z_1\ a_3\ z_2\ o_1\ 274\ m_1\ *_3\ 274\ 276\ d_1$

NOTE: * = SPACE

| ACT-ION | PREV CODE | CURR CODE | PREV STRING BUFFER | PREV STRG CNTR | CURR STRG BUFF | CURR STRG CNTR | EXTENDED STRING REGISTER | CODE CNTR | DICT CODE | DICT CHAR | OUT PUT | BLOCKS OF FIGURES 8-11 |
|---|---|---|---|---|---|---|---|---|---|---|---|---|
| 1 | | $a_1$ | | | | | | 258 | | | $a_1$ | 150-157 |
| 2 | $a_1$ | $b_1$ | $a_1$ | 1 | | | $a_1b_1$ | 259 | $a_1$ | $b_1$ | | 160-162,180-184 |
| 3 | $b_1$ | | $b_1$ | 1 | | | | | | | $b_1$ | 185-188,170,171,156,157 |
| 4 | $b_1$ | 258 | | | $a_1b_1$ | 2 | $b_1a_1$ | 260 | $b_1$ | $a_1$ | $a_1b_1$ | 160-163,200-207 |
| 5 | | | $a_1b_1$ | 2 | | | | | | | | 208-212 |
| 6 | 258 | 260 | $a_1b_1a_1$ | 3 | | | | | 258 | | $a_1b_1a_1$ | 160-163,220-222 |
| 7 | 260 | $b_2$ | | | | | $a_1b_1a_1b_2$ | 261 | | | $b_2$ | 223-226,160-162,180-182,188,170,171 |
| 8 | $b_2$ | $e_1$ | $b_2$ | 1 | | | $b_2e_1$ | 262 | $b_2$ | $e_1$ | | 156,157,160-162,180-184 |
| 9 | $e_1$ | $x_1$ | $e_1$ | 1 | | | $e_1x_1$ | 263 | $e_1$ | $x_1$ | $e_1$ | 185-188,170,171,156,157,160-162,180-184 |
| 10 | $x_1$ | $*_1$ | | | | | | | | | $x_1$ | 185-188,170-173 |
| 11 | $*_1$ | $x_2$ | $*_1$ | 1 | | | $*_1x_2$ | | | | $*_1$ | 170,171,156,157,160-162,180-183,188 |
| 12 | | 260 | $a_1b_1a_1$ | 3 | | | | | | | $x_2$ | 170-175 |
| 13 | 260 | $q_1$ | | | $a_1b_1a_1q_1$ | | | | | | $a_1b_1a_1$ | 176,160-162,180-182,188 |
| 14 | $q_1$ | $u_1$ | $q_1$ | 1 | | | $q_1u_1$ | 264 | $q_1$ | $u_1$ | $q_1$ | 170,171,156,157,160-162,180-184 |
| 15 | $u_1$ | $*_2$ | $u_1$ | 1 | | | $u_1*_2$ | 265 | $u_1$ | $*_2$ | $u_1$ | 185-188,170,171,156,157,160-162,180-184 |
| 16 | $*_2$ | 263 | $*_2$ | 1 | | | $*_2q_1$ | 266 | $*_2$ | $q_1$ | $*_2$ | 185-188,170,171,156,157,160-163 |
| 17 | | | | | $q_1u_1$ | 2 | | | | | $q_1u_1$ | 200-207 |
| 18 | 263 | $a_2$ | $q_1u_1$ | 2 | | | $q_1u_1a_2$ | 267 | 263 | $a_2$ | | 208-212,160-162,180-184 |
| 19 | $a_2$ | 265 | $a_2$ | 1 | | | | | | | $a_2$ | 185-188,170,171,156,157,160-163 |

Figure 12A

| | | $*_2q_1$ | | 2 | $a_2*_1$ | | $a_2$ | $*_2$ | $*_2q_1$ | |
|---|---|---|---|---|---|---|---|---|---|---|
| 20 | | | | | | | | | | 200-207 |
| 21 | 265 | $i_1$ | | 2 | $*_2q_1i_1$ | 268 | | | $i_1$ | 208-212,160-162,180-183,188,170,171 |
| 22 | $i_1$ | 259 | $b_1a_1$ | 1 | $i_1b_1$ | | $i_1$ | $b_1$ | $b_1a_1$ | 156,157,160-163,200-207 |
| 23 | 259 | $b_3$ | | 2 | $b_1a_1b_3$ | 269 | 259 | $b_3$ | | 208-212,160-162,180-184 |
| 24 | $b_3$ | $q_2$ | | 1 | $b_3q_2$ | 270 | $b_3$ | $q_2$ | $b_3$ | 185-188,170,171,156,157,160-162,180-184 |
| 25 | $q_2$ | $i_2$ | | 1 | $q_2i_2$ | 271 | $q_2$ | | $q_2$ | 185-188,170,171,156,157,160-162,180-183,188 |
| 26 | $i_2$ | $z_1$ | | 1 | $i_2z_1$ | | $i_2$ | $z_1$ | $i_2$ | 170,171,156,157,160-162,180-184 |
| 27 | $z_1$ | $a_3$ | | 1 | $z_1a_3$ | 272 | $z_1$ | $a_3$ | $z_1$ | 185-188,170,171,156,157,160-162,180-184 |
| 28 | $a_3$ | $z_2$ | | 1 | $a_3z_2$ | 273 | $a_3$ | $z_2$ | $a_3$ | 185-188,170,171,156,157,160-162,180-184 |
| 29 | $z_2$ | $o_1$ | | 1 | $z_2o_1$ | 274 | $z_2$ | $o_1$ | $z_2$ | 185-188,170,171,156,157,160-162,180-184 |
| 30 | $o_1$ | 274 | | 1 | | 275 | $o_1$ | | $o_1$ | 185-188,170,171,156,157,160-163 |
| 31 | | | $z_2o_1$ | 2 | $o_1z_2$ | | | $z_2$ | $z_2o_1$ | 200-207 |
| 32 | 274 | $m_1$ | | 2 | $z_2o_1m_1$ | 276 | | | | 208-212,160-162,180-183,188 |
| 33 | $m_1$ | $*_3$ | | 1 | $m_1*_3$ | | $m_1$ | $*_3$ | $m_1$ | 170,171,156,157,160-162,180-184 |
| 34 | $*_3$ | 274 | | 1 | | 277 | $*_3$ | | $*_3$ | 185-188,170,171,156,157,160-163 |
| 35 | | | $z_2o_1$ | 2 | $*_3z_2$ | | $*_3$ | $z_2$ | $z_2o_1$ | 200-207 |
| 36 | 274 | $z_2o_1$ | $m_1*_3$ | 2 | $z_2o_1m_1$ | 278 | | | $m_1*_3$ | 208-212,160-163,200-206 |
| 37 | 276 | $d_1$ | | 2 | $m_1*_3d_1$ | | 276 | $d_1$ | | 211,212,160-162,180-184 |
| 38 | $d_1$ | • | | 1 | | 279 | | $d_1$ | $d_1$ | 185-188,170,171,156,157,160 |

DATA COMPRESSION AND DECOMPRESSION METHOD AND APPARATUS WITH EMBEDDED FILTERING OF INFREQUENTLY ENCOUNTERED STRINGS

BACKGROUND OF THE INVENTION

1. Field of the Invention

The invention relates to LZ data compression and decompression systems particularly with respect to preventing storage of infrequently encountered data character strings in the compressor and decompressor dictionaries.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW, adopted as the standard for V.42 bis modem compression and decompression, is described in U.S. Pat. No. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, Jul. 31, 1990. TIFF is a development of Aldus Corporation and the name TIFF is a Trademark thereof. Reference to the TIFF specification is found in TIFF, Revision 6.0, Final—Jun. 3, 1992.

Further examples of LZ dictionary based compression and decompression systems are described in the following U.S. patents: U.S. Pat. No. 4,464,650 by Eastman et al., issued Aug. 7, 1984; U.S. Pat. No. 4,814,746 by Miller et al., issued Mar. 21, 1989; U.S. Pat. No. 4,876,541 by Storer, issued Oct. 24, 1989; U.S. Pat. No. 5,153,591 by Clark, issued Oct. 6, 1992; U.S. Pat. No. 5,373,290 by Lempel et al., issued Dec. 13, 1994; U.S. Pat. No. 5,838,264 by Cooper, issued Nov. 17, 1998; U.S. Pat. No. 5,861,827 by Welch et al., issued Jan. 19, 1999; and U.S. Pat. No. 5,951,623 by Reynar et al., issued Sep. 14, 1999.

In the above dictionary based LZ compression and decompression systems, the compressor and decompressor dictionaries may be initialized with all of the single character strings of the character alphabet. In some implementations, the single character strings are considered as recognized although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment, the alphabet has an 8 bit character size supporting an alphabet of 256 characters. Thus, the characters have values of 0–255. The first available multiple character string code can, for example, be 258 where the codes 256 and 257 are utilized as control codes as is well known.

In the prior art dictionary based LZ compression and decompression systems, specific methodologies often require that the dictionary be limited to a fixed size. For example, in the GIF protocol, the dictionary is limited to a maximum of 4095 strings with a concomitant maximum code size of 12 bits. When filled to maximum capacity, the dictionary may be frozen and utilized with the extant stored strings to perform further compression until such time as it is desirable to clear the dictionary contents.

During operation of the LZ methodology, the dictionary fills with data character strings and string fragments some of which may be only infrequently encountered. Thus, a number of the available codes may be occupied with string fragments that may only rarely, if ever again, be encountered. The codes so occupied would not significantly contribute to the compression of the input data character stream. Since, as discussed above, the dictionary may be limited in size, the number of available codes occupied by these rarely encountered string fragments may be significant which, it is believed, will have an adverse effect on compression efficiency.

The present inventor believes that excluding infrequently encountered strings from the dictionary would improve compression performance. It is furthermore believed that no method or apparatus exists in the data compression/decompression art for specifically excluding infrequently encountered strings from being stored in the dictionary and occupying valuable dictionary codes.

In said U.S. Pat. No. 5,951,623, a pre-filled dictionary is used in combination with a data specific dictionary where the pre-filled dictionary is pre-loaded with commonly occurring character sequences. The data specific dictionary is utilized in the normal LZ compression mode and the longest match from either the pre-filled dictionary or the data specific dictionary is utilized as the compressed output. Extended strings are stored in the data specific dictionary. It is believed that rarely occurring character sequences may be entered into the data specific dictionary since these rarely occurring sequences have no counterpart in the pre-filled dictionary. Even though the pre-filled dictionary stores frequently occurring sequences, infrequently occurring sequences can still usurp valuable codes from the data specific dictionary as discussed above.

It is an objective of the present invention to provide a data compression and decompression system that prevents infrequently occurring data character strings from occupying valuable codes in the compression and decompression dictionaries.

SUMMARY OF THE INVENTION

The system of the present invention includes a data compressor for compressing an input stream of data characters into an output stream of compressed codes. A dictionary stores strings of data characters encountered in the input stream, the stored strings having respective codes associated therewith. The input stream is searched by comparing the input stream to the stored strings to determine the longest match therewith. The code associated with the longest match is output so as to provide the output stream of compressed codes. An exclusion table is included storing strings of data characters to be excluded from storage in the dictionary. An extended string is formed comprised of the longest match extended by the next data character in the input stream. If it is not in the exclusion table, the extended string is stored in the dictionary and a code is assigned thereto. If it is in the exclusion table, the extended string is not stored and the code remains available for another string.

Specifically, the input stream is compared to the strings stored in the dictionary until a mismatching input character occurs. In this manner the longest match is determined. The mismatching character is used to begin the next string search unless it is included in the exclusion table. If so, the mismatching character is outputted and further input data characters are fetched and outputted until an input data character is fetched that is not in the exclusion table. This character is then used to begin the next string search.

A data decompressor includes the same exclusion table as included in the compressor. Utilizing the exclusion table, the decompressor excludes the same strings from storage in the decompressor dictionary as are excluded from storage in the compressor dictionary.

BRIEF DESCRIPTION OF THE DRAWINGS

FIG. 2 is a data structure diagram illustrating details of the exclusion tables utilized in the data compressor of FIG. 1 and the data decompressor of FIG. 7.

FIG. 5 is a specific example of exclusion tables utilized in an illustrative embodiment of the invention to be described herein.

FIG. 6, comprised of FIGS. 6A, 6B and 6C, is a chart exemplifying the operations of the compressor of FIG. 1 in accordance with the control flow chart of FIG. 4 and the exclusion tables of FIG. 5.

FIG. 12, comprising of FIGS. 12A and 12B, is a chart exemplifying the operations of the decompressor of FIG. 7 in accordance with the control flow charts of FIGS. 8–11 and the exclusion tables of FIG. 5.

DESCRIPTION OF THE PREFERRED EMBODIMENTS

The best mode embodiments described below are predicated on the LZW methodology and utilizes the implementation described above where the single character strings are considered as recognized by the compressor and decompressor although not explicitly initialized therein.

Figure 1:
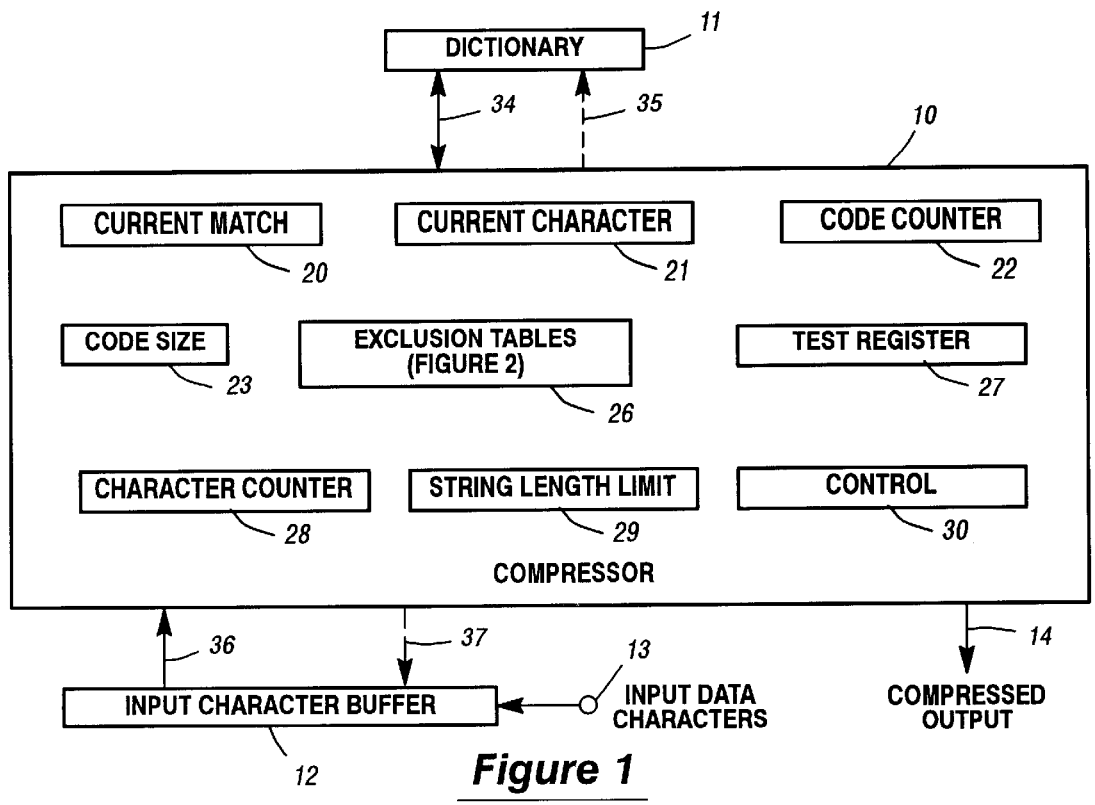
FIG. 1 is a schematic block diagram of a data compressor for compressing data in accordance with the present invention.

Referring to FIG. 1, a data compressor 10, together with a Dictionary 11 and an Input Character Buffer 12, compresses a stream of input data characters applied at an input 13 into a stream of corresponding compressed codes at an output 14.

The compressor 10 includes a Current Match register 20, a Current Character register 21, a Code Counter 22 and a Code Size register 23. The Code Counter 22 sequentially generates code values to be assigned to data character strings stored in the Dictionary 11 in a well known manner. The Code Size register 23 is utilized, as is well known, to control the number of bits utilized for transmitting the compressed codes from the output 14.

The compressor 10 further includes Exclusion Tables 26 for storing data character strings to be excluded from storage in the Dictionary 11. Details of the Exclusion Tables 26 are illustrated in FIG. 2. Also included in the compressor 10 is a Test Register 27 for assembling an extended string. The Test register 27 is utilized to facilitate testing if the extended string is in the Exclusion Tables 26. A Character Counter 28 is included to provide a count of the number of characters in the extended string in the Test Register 27. The character count is utilized to facilitate searching the Exclusion Tables 26 in a manner to be described.

The compressor 10 further includes a String Length Limit register 29 for storing a string length limit parameter indicating the maximum length string to be stored in the Dictionary 11. The compressor 10 additionally includes control 30 for controlling the operations of the compressor 10 in accordance with the operational flow chart of FIG. 4 to be described below.

The Dictionary 11 is included for storing data character strings in cooperation with the compressor 10. Data is communicated between the compressor 10 and the Dictionary 11 via a bi-directional data bus 34 under control of a control bus 35. The Dictionary 11 is conveniently configured and utilized for string searching and storage in any well known manner described in the prior art (e.g., see said U.S. Pat. Nos. 4,558,302; 5,838,264 or 5,861,827).

The Input Character Buffer 12 buffers the input data character stream received at the input 13. The input data characters are applied from the Input Data Character Buffer 12 via a bus 36 to the Current Match register 20 and the Current Character register 21 in accordance with operations to be described. The compressor 10 controls acquiring input data characters from the Input Data Character Buffer 12 via a control bus 37.

Referring to FIG. 2, the Exclusion Tables 26 include a Table 40 of single character strings, a Table 41 of character pair strings, a Table 42 of character triplet strings, up to a Table 43 of strings having a number of characters equal to the string length limit stored in the String Length Limit register 29 of FIG. 1. It will be understood from the below described operation of the compressor 10 that a string stored in any of the Tables 40–43 will be excluded from storage in the Dictionary 11. It will furthermore become clear that no extension of any string stored in any of the Tables 40–43 will be stored in the Dictionary 11. For example, any string that begins with a character in the Table 40 will be excluded from storage in the Dictionary 11. Similarly, no string that begins with a character pair in the Table 41 will be stored in the Dictionary 11. Additionally, it will become clear from the descriptions given below that no string longer than the string length limit in the String Length Limit register 29 (FIG. 1) will be stored in the Dictionary 11. Thus, the longest strings that are stored in the Exclusion Tables 26 are stored in the Table 43 and are of length equal to the string length limit.

A preferred implementation of the Exclusion Tables 26 has an "inverse" prefix property, i.e., the Tables 40–43 are populated so that no prefix of a string stored in a particular table will be stored in any preceding table. For example, if the string "zom" is stored in the Table 42 of character triplets, the single character prefix "z" will not be included in the Table 40 and the prefix pair "zo" will not be included in the Table 41. This arrangement of the Exclusion Tables 26 is possible because of the operational property of the compressor 10 that no extension of a string stored in the Exclusion Tables 26 will be stored in the Dictionary 11.

With continued reference to FIGS. 1 and 2, the operation of the compressor 10, briefly, is as follows. At the beginning of a compression cycle, the Current Match register 20 contains the mismatching character determined from the preceding compression cycle. At the beginning of the cycle, the Exclusion Tables 26 are consulted to determine if the character in the Current Match register 20 is included in the Table 40 of single characters. If so, the character is outputted and the next input data character is fetched to the Current Match register 20. This continues until the fetched character in the Current Match register 20 is not in the Exclusion Tables 26. The character in the Current Match register 20 is then shifted into the previously cleared Test register 27 and 1 is added to the previously cleared Character Counter 28. The next input data character is then fetched to the Current Character register 21. This character is also shifted into the Test register 27 and the Character Counter 28 is again incremented by 1.

The Dictionary 11 is searched for the string represented by the current match concatenated with the current character. If the string is found in the Dictionary 11, the string code thereof is loaded into the Current Match register 20 and the next input data character is fetched to the Current Character register 21. This character is also shifted into the Test register 27 and the Character Counter 28 is again incremented. The search continues until the string represented by the contents of the Current Match register 20 and the Current Character register 21 is not found in the Dictionary 11, the character in the Current Character register 21 comprising the mismatching character. In this manner, the input data character stream is matched against the strings in the Dictionary 11 until the longest match is determined. The code of the longest matching string is output at the compressed output 14 from the Current Match register 20 utilizing the number of bits determined by the Code Size register 23.

The string not found in the Dictionary 11 is stored therein at the code assigned by the Code Counter 22 unless the character count in the Character Counter 28 is greater than the string length limit in the String Length Limit register 29 or the string is included in the Exclusion Tables 26. The Test register 27 and the Character Counter 28 facilitate the inquiry into the Exclusion Tables 26 since the character count indicates which of the Tables 40–43 should be consulted and the Test register 27 contains the extended string being tested. If the string length is not greater than the string length limit and the string is not in the Exclusion Tables 26, it is stored in the Dictionary 11 at the code assigned by the Code Counter 22 and the Code Counter 22 is incremented by 1. If the string is excluded either because of string length or inclusion in the Exclusion Tables 26, the Dictionary 11 is not updated and the Code Counter 22 is not incremented. Whichever action is taken, the compression cycle is concluded by setting the Current Match register 20 to the character in the Current Character register 21.

The first cycle is initiated by fetching the first input data character to the Current Match register 20.

The Exclusion Tables 26 may be manually populated by a practitioner in the art having knowledge of the string distribution statistics of the type of data being compressed. For example, for English language text, it may be desirable to exclude all strings beginning with the letter "x". Thus, the character "x" will be stored in the Table 40 of single characters. It may furthermore be desirable to attempt to exclude all "words" beginning with the letter "x". In this case the pair, for example, "*x" may be stored in the Table 41 of character pairs, where "*" represents a space. Useful information regarding English language statistics may be found in an article by Marcus et al., "Building a Large Annotated Corpus of English: The Penn Treebank", Computational Linguistics, Vol. 19, No. 2, pp. 313–330 (1993), and in the book by G. Zipf "Human Behavior and the Principle of Least Effort", 1949.

If a manual process of populating the Exclusion Tables 26 is undesirable, an automatic procedure is provided herein. This procedure for identifying infrequently encountered strings is a modification of the procedure described in said U.S. Pat. No. 5,951,623 wherein frequently encountered strings are identified.

Figure 3:
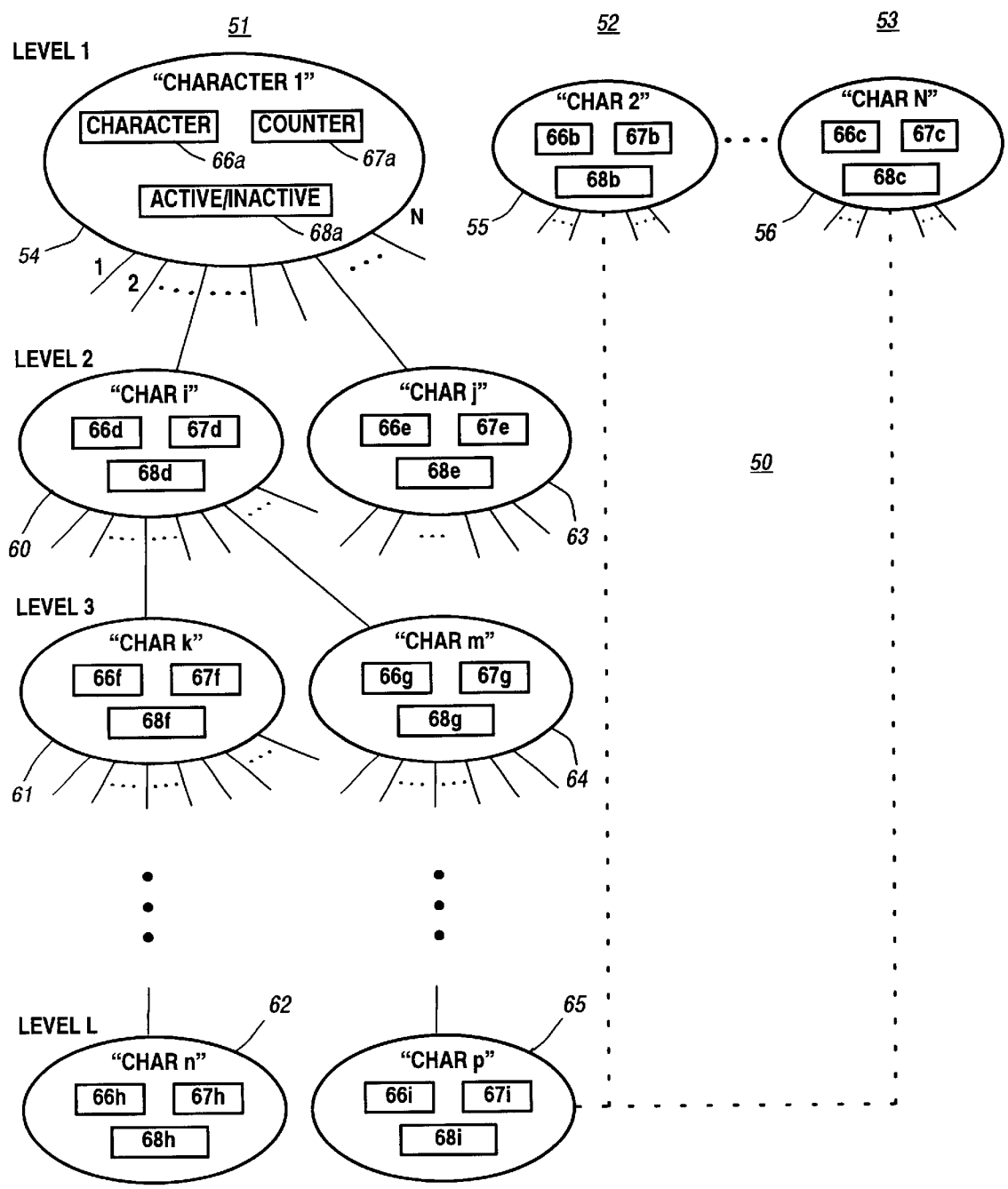
FIG. 3 is a data structure diagram illustrating a tree structure utilized in determining the strings with which to populate the exclusion tables of FIG. 2.

Referring to FIG. 3, a tree data structure 50 is illustrated that is utilized in selecting the strings for populating the Exclusion Tables 26. The data structure 50 is comprised of a plurality of linked list trees 51–53, one for each character of the alphabet over which compression is being performed. The trees 51–53 begin with respective root nodes 54–56 representing the respective N characters of the alphabet. For the trees 52 and 53 only the root nodes 55 and 56 are illustrated for simplicity. Each tree, such as the tree 51, is further comprised of linked descendent nodes 60–65. Each node represents a character of a string and a string is stored in a tree by a path from the root node through the linked nodes representing the string characters. For example, the string "char 1, char i, char k" is represented by the nodes 54, 60 and 61. It is appreciated by way of further example that the sub-string "char 1, char i" is stored by the nodes 54 and 60 while the string "char 1, char j" is stored by the nodes 54 and 63.

The trees 51–53 are arranged in levels denoted as Level 1, Level 2, Level 3, . . . Level L. The root nodes of the trees are in Level 1. The children nodes of the roots are in Level 2. The grandchildren nodes are in Level 3 and the leaf nodes are in Level L. The depth of the trees are chosen such that a path from the root to a Level L node stores a string having the number of characters equal to the string length limit parameter stored in the String Length Limit register 29 (FIG. 1). It is thus appreciated that the root nodes at Level 1 represent single character strings, the nodes at Level 2 represent character pairs, the nodes at Level 3 represent character triplets and the nodes at Level L represent strings of string length limit characters.

The nodes include respective character fields 66($a$–$i$) for storing the respective characters represented by the nodes. The nodes further include respective counters 67($a$–$i$) for maintaining respective counts of the number of times the respective node have been visited in a manner to be described. The nodes additionally include respective Active/Inactive fields 68($a$–$i$) for indicating the respective active or inactive status of the nodes for reasons to be discussed.

The manner in which the tree data structure 50 is utilized to identify strings with which to populate the Exclusion Tables 26 will now be described. A large sample of the data over which compression is to be performed is provided. Initially, the data structure 50 includes only the root nodes at Level 1, one node being provided for each character of the alphabet with the character field 66 thereof set to the respective alphabet character. The counters 67 of the root nodes are set to 0 and the Active/Inactive fields 68 thereof are set to indicate "Active".

The first character of the sample is then read into the appropriate root node by adding 1 to the counter 67 thereof. The L-1 characters following the first character are sequentially read into the tree by creating a linked chain of descendent nodes from the root node for Level 2 through Level L and setting the character fields 66 thereof to the respective character values. The counters 67 of these created nodes are set to 1 and the fields 68 thereof are set to "Active".

The same procedure is repeated but now utilizing the $2^{nd}$ character of the sample and the L-1 characters following the $2^{nd}$ character, using the appropriate root node and creating the appropriate nodes descendent therefrom. It is appreciated that as the process continues, appropriate descendent nodes may already have been created for some or all of the characters of a string being read into the data structure. If the node for the character already exists when the character is read, the counter 67 of the node is increased by 1. This process is continued for each character of the sample until all of the character strings of the sample have been read into the data structure 50.

By the above described process, all of the strings in the sample including single character strings, character pairs, character triplets up to strings having string length limit characters are stored in the trees 51–53 of the data structure 50 with the number of occurrences of each string provided by the associated counter 67. Since strings are read into the trees of the data structure 50 from the root down to the leaves, the count in a counter 67 of a node will be greater than or equal to the count in the counters 67 of all of the descendent nodes thereof.

With continued reference to FIGS. 2 and 3, the data structure 50, with all of the strings of the sample read therein, is utilized to populate the Exclusion Tables 26 in the following manner. The single character strings for populating Table 40 are derived from the Level 1 root nodes of the data structure 50. The character pair strings for populating the Table 41 are derived from the Level 2 nodes which, as discussed above, represent the character pair strings. Similarly, the character triplet strings for populating the Table 42 are derived from the Level 3 nodes and the Tables following the Table 42 are populated from the corresponding levels of the tree structure 50. The last Table 43 is populated from the strings derived from Level L.

A string is utilized to populate a Table if the count in the associated counter 67 is less than a predetermined threshold. The threshold can be the same for the entire data structure 50 or different thresholds can be utilized at different levels. The threshold or thresholds are established based on the actual distribution of the number of occurrences reflected in all of the counters 67. The higher the threshold, the larger will be the number of strings that will be stored in the Exclusion Tables 26 and thus excluded from storage in the Dictionary 11 of FIG. 1.

The process begins by populating Table 40 with the single character strings from Level 1 of the data structure 50. A single character string from a node of Level 1 is stored in the Table 40 if the count in the counter 67 associated with the node is less than the threshold. When a node of Level 1 is utilized to provide a string for the Table 40, all of the nodes in the lower levels of the data structure 50 that are descendents of the root node so utilized are rendered inactive by setting the associated fields 68 of these descendent nodes to the "Inactive" state. In other words, if a root node from Level 1 is selected to populate Table 40, the entire tree descendent therefrom is inactivated.

In a similar manner, Table 41 of the Exclusion Tables 26 is populated with character pairs as follows. As discussed, the nodes of Level 2 represent character pairs. The character pairs for populating the Table 41 are identified from the Level 2 nodes where the associated fields 68 are active and the counts in the associated counters 67 are below the threshold. The character pair is derived from such a Level 2 node and the parent node in Level 1 with which it is linked. For example if node 63 is selected, the character pair entered into Table 41 is "char 1, char j" to All of the descendent nodes in Level 3 through Level L of a selected node in Level 2 are rendered inactive by appropriately setting the fields 68 thereof. For example if node 60 is selected for populating Table 41, the descendent nodes rendered inactive include nodes 61, 62, 64 and 65.

In the manner described with respect to Table 41 and Level 2, the Tables 42 through 43 are populated from Level 3 through Level L, respectively. Of course, since Level L is comprised of the leaves of the data tree structure 50, there are no lower levels to deactivate when populating the Table 43 from the active Level L nodes. The string for populating the Table being processed is derived from the selected node of the associated level by tracing upward through the tree from the selected node through the linking nodes back to the root. For example, if node 65 is selected from Level L to provide the string associated therewith for populating the Table 43, the tree 51 is accessed from the node 65 back through the nodes 64, 60 and 54 to provide the string "char 1, char i, char m, . . . ,char p" for populating the Table 43.

The retrieval of strings from the data structure 50 is facilitated by the fact that every node has at most one incoming branch from a higher node. Thus, the backward trace from a node to a root traverses a unique set of nodes, thereby providing a unique string for populating a Table in the Exclusion Tables 26.

Figure 4:
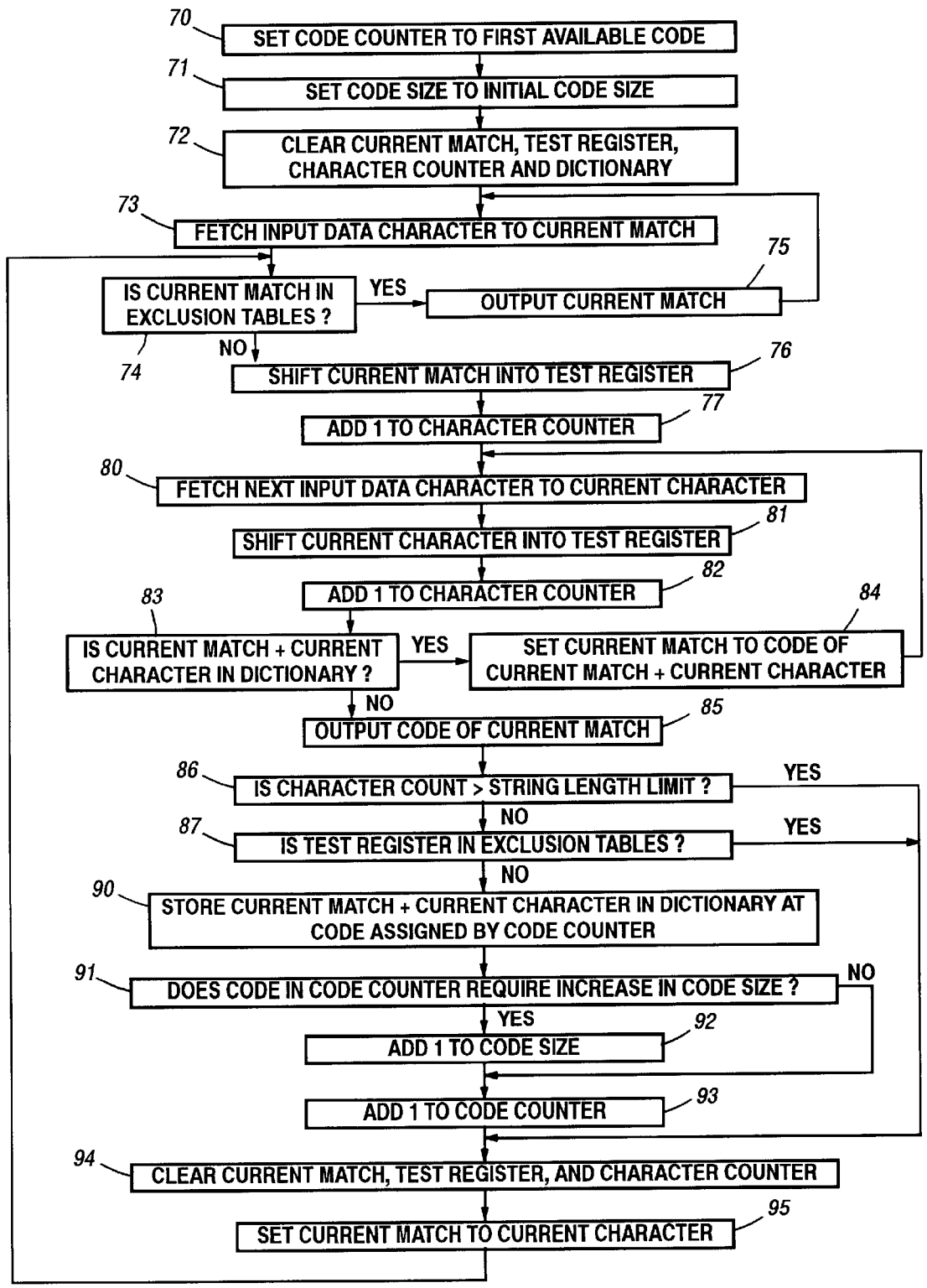
FIG. 4 is a control flow chart illustrating the operations executed by the compressor of FIG. 1 so as to perform data compression in accordance with the present invention.

Referring to FIG. 4, with continued reference to FIGS. 1 and 2, a control flow chart is illustrated showing the detailed operations to be executed by the compressor 10. The control 30 of the compressor 10 is considered as containing appropriate circuitry such as state machines, or appropriate software, to control execution of the operations. The flow chart of FIG. 4 is predicated on a variable length output and the Code Size register 23 is utilized to this effect. In an ASCII variable length code implementation, the Code Size may begin with 9 bits and sequentially increase to 10, 11 and 12 bits at codes 512, 1024 and 2048, respectively.

Accordingly, at a block 70, the Code Counter 22 is initialized to a first available coder for example, 258 in the ASCII environment. At a block 71, the Code Size register 23 is initialized to the beginning Code Size, for example, 9 bits in ASCII embodiments. At a block 72, the Current Match register 20, the Test register 27, the Character Counter 28 and the Dictionary 11 are cleared.

At a block 73, an input data character is fetched to the Current Match register 20. If processing entered the block 73 from the block 72, this is the first data character fetched from the input data character stream. At a block 74, the Exclusion Tables 26 are consulted to determine if the character in the Current Match register 20 is included as a single character string to be excluded. Thus, at the block 74, it is only necessary to consult the Table 40 of single characters. If the character in the Current Match register 20 is included in Table 40, the YES branch from the block 74 is taken to a block 75. At the block 75, the character in the Current Match register 20 is outputted from the Current Match register 20 at the compressed output 14 utilizing the number of bits designated by the Code Size register 23. Processing returns to the block 73 from the block 75 to fetch the next input data character to the Current Match register 20.

If, at the block 74, the character in the Current Match register 20 is not in the Exclusion Tables 26, the NO branch from the block 74 is taken to a block 76. At the block 76, the character in the Current Match register 20 is shifted into the Test register 27 and, at a block 77, the count in the Character Counter 28 is incremented by 1.

At a block 80, the next input data character is fetched to the Current Character register 21. At a block 81, the character in the Current Character register 21 is shifted into the Test register 27 and, at a block 82, the count in the Character Counter 28 is incremented by 1. It is appreciated that as the characters of a string are being fetched from the input data character stream at the block 80, the characters of the string are entered into the Test register 27 and are counted by the Character Counter 28 in order to facilitate the string processing to be described.

Processing continues at a block 83 whereat the Dictionary 11 is searched to determine if the string corresponding to the code in the Current Match register 20 concatenated by the character in the Current Character register 21 is in the Dictionary 11. Dictionary searching procedures are well known in the art for performing the function of the block 83 (e.g., see said U.S. Pat. Nos. 4,558,302; 5,838,264 or 5,861,827).

If, at the block 83, the string is found in the Dictionary 11, the YES branch from the block 83 is taken to a block 84. At block 84, the contents of the Current Match register 20 is updated to contain the code of the string that was found. After updating the Current Match register 20 with the currently matched string, control returns to the block 80 to fetch the next input data character to the Current Character register 21. Processing continues as described above with the blocks 81 and 82 wherein the currently fetched character is shifted into the Test register 27 and the Character Counter 28 is incremented by 1.

In this manner, the loop formed by the blocks 80–84 compares the input data character stream with the strings stored in the Dictionary 11 to find the longest match therewith. Additionally, the input data character string being extended, and searched in the Dictionary 11, continues to be extended and stored in the Test register 27 while the count of the number of characters in the string is maintained in the Character Counter 28.

At the block 83, when the concatenation of the currently matched string with the next character fetched at the block 80 results in an extended string that is not in the Dictionary 11, the NO branch from the block 83 is taken to a block 85. At the block 85, the code of the Current Match is output as part of the compressed code stream provided at the compressor output 14. The code of the Current Match is provided by the Current Match register 20 and is output utilizing the number of bits denoted by the Code Size register 23. When Current Match is a multiple character string, the code of the string resides in the Current Match register 20 and was the longest match found in the Dictionary 11 as described above with respect to the block 83. It is appreciated that the Current Match that is output at the block 85 can also be a single character. The output code in this case is the value of the character which is also provided from the Current Match register 20.

Processing proceeds to a block 86 whereat the count in the Character Counter 28 is compared to the string length limit in the String Length Limit register 29 to determine if the character count of the extended string that was not found in the Dictionary 11 at the block 83 is greater than the string length limit. The test of block 86 is performed so that extended strings that might otherwise have been stored in the Dictionary 11 can be excluded therefrom if the string is longer than a predetermined length. This feature is included in the preferred embodiment of the present invention because of the observation that strings of non-repetitive characters greater than a certain length tend not to be repeated depending on the statistics of the data, the size of the alphabet and the size of the Dictionary. For example, it has been observed in the GIF environment where a limited size dictionary is utilized, that with a 256 character alphabet and non-repetitive data, strings of approximately 4 or 5 characters are rarely repeated.

Thus, strings greater than the string length limit may be excluded from storage in the Dictionary 11 because such strings may be only infrequently, if ever again, encountered. In this manner, string codes assigned by the Code Counter 22 are prevented from being usurped by such infrequently encountered strings.

Optionally, the present invention may be implemented without utilizing the feature represented by the block 86. If it is desired so to do, the block 86 would be eliminated. Furthermore, the string length limitation may be bypassed if a repeating character run is occurring in the input data character stream. This embodiment modification will be described with respect to FIGS. 13A and B.

If, at the block 86, the character count is not greater than the string length limit, the NO branch is taken from the block 86 to a block 87. At the block 87, the Exclusion Tables 26 are consulted to determine if the string in the Test register 27 is included therein. The appropriate one of the Tables 40–43 is consulted depending on the character count in the Character Counter 28. If, for example, the Character Counter 28 indicates that the extended string in the Test register 27 is comprised of three characters, the Table 42 of character triplets is consulted. If the extended string in the Test register 27 is not included in the Exclusion Tables 26, the NO branch from the block 87 is taken to a block 90.

As discussed above, the string in the Test register 27 is the extended string that was not found in the Dictionary 11 at the block 83. At the block 90, this extended string is entered into the Dictionary 11 and the extant code of the Code Counter 22 is assigned to this stored extended string. Details of specific implementations for the function of the block 90 are well known (e.g., see said U.S. Pat. Nos. 4,558,302; 5,838,264 or 5,861,827).

Processing then proceeds to a block 91 whereat the code in the Code Counter 22 is tested to determine if an increase in the code size is required. If so, processing continues to a block 92 whereat the Code Size register 23 is incremented by 1. If an increase in Code Size is not required at the block 91, the block 92 is bypassed to continue processing at a block 93. At block 93, the Code Counter 22 is incremented by 1.

If at the block 86, the character count is greater than the string length limit or if, at the block 87, the extended string in the Test register 27 is included in the Exclusion Tables 26, the associated YES branch from the block 86 or 87 is taken to bypass the processing of the blocks 90–93. When this occurs, the extended string is not stored in the Dictionary 11 and the Code Counter 22 is not incremented.

Whether the extended string is stored in or excluded from the Dictionary 11, processing continues at a block 94. At the block 941 the Current Match register 28, the Test register 27 and the Character Counter 28 are cleared. At a block 95, the character in the Current Character register 21 is set into the Current Match register 20. Thus, the Current Match register 20 is set with the character that resulted in the mismatch at the block 83. This character is utilized to begin the next compression cycle and, accordingly, control returns to the block 74.

It is appreciated that aside from the blocks 72, 74–77, 81, 82, 86, 87 and 94 (the blocks 72 and 94 as related to the Exclusion Tables 26, the Test register 27 and the Character Counter 28) the remainder of FIG. 4 depicts standard LZW data compression processing. Thus, any known implementation of LZW data compression can be utilized in implementing the LZW data compression aspects of the present invention.

Referring to FIG. 5, in which like reference numerals indicate like elements with respect to FIG. 2, an example of Exclusion Tables 26 is provided to be utilized with the operational example of FIG. 6 given below. It is noted that the character "*" represents the character "space". It is appreciated that the strings entered into Tables 40–42 are illustrated by way of example to demonstrate the operations of the compressor and decompressor embodiments disclosed herein. The illustrated strings do not necessarily represent particular input data statistics.

Referring to FIG. 6, with continued reference to FIGS. 1, 4 and 5, an example of the operation of the compressor 10 in accordance with the flow chart of FIG. 4 is illustrated. At the top of FIG. 6, an input data character stream is shown where sequential characters are identified by character sequence numbers. This is done to facilitate following the progress of the characters through the steps of the example. It is appreciated that the sequence numbers are shown for purposes of character identification and do not appear in the actual data character stream. It is noted that the symbol "*" represents the character "space". The operational example of FIG. 6 utilizes the Exclusion Tables of FIG. 5 and the String Length Limit register 29 is set to "3".

The example is largely self-explanatory, with the actions performed delineated in the left-hand column and the blocks of FIG. 4 that participate in the actions designated in the right-hand column. The Test register column depicts the string under consideration at an action and the Character Counter column indicates the number of characters in the string.

In actions 1–7, standard LZW data compression is performed on the input data character stream with appropriate extended strings being stored in the Dictionary in actions 2, 4 and 7 with the indicated codes from the Code Counter assigned thereto. Strings are not excluded, in accordance with the invention, since the NO branches from blocks 74, 86 and 87 of FIG. 4 are taken. Actions 8–11 depict operations where the string is extended beyond the string length limit. Action 11 depicts a string of four characters that is longer than the predetermined string length limit of three characters. It is observed in actions 8–11 that although the longest match code is output at action 11, no string is stored in the Dictionary and the Code Counter is not advanced. Without the string length limitation, action 11 indicates that the string "abab" would have been stored in the Dictionary at the code 261 and the Code Counter would have been advanced to code 262. Instead, as indicated in action 13, the potentially more useful string "be" is stored in the Dictionary at the code 261.

In actions 15–25, strings are excluded from storage as follows. In action 15, the string "ex" is stored in the Dictionary at code 262 and in action 16 the Code Counter is advanced to code 263. In addition, the mismatching character "x" is transferred to the Current Match register and at block 74 of FIG. 4 is found to be in the Exclusion Tables. Thus, the character "x" is output and the next character "*" fetched to the Current Match register in action 17. In action 18, the string "*x" is found in the Exclusion Tables at the block 87 and thus is excluded from storage in the Dictionary. Processing continues and at action 23 the string being searched exceeds the string length limit and the string "abaq" is not stored. When processing reaches the action 25, the code 263 is then utilized for the string "qu".

In actions 37, 46, 59 and 66, the respective extended strings in the Test register are found in the Exclusion Tables and thus excluded from storage in the Dictionary at the block 87. The respective codes from the Code Counter that would otherwise have been usurped by these strings are utilized for storing other strings which may tend to be more useful.

More detailed descriptions of the actions of FIG. 6 relative to the blocks of FIG. 4 are readily apparent and will not be provided for brevity.

It is appreciated from FIGS. 4 and 6, that the exclusion of strings from the Dictionary based on the Exclusion Tables is interwoven into the LZW processing so that even if a string is excluded, the string still benefits from whatever compression the string prefix has achieved. This occurs because the code of the prefix of the excluded string is output at block 85 of FIG. 4 as the longest match for the compression cycle. For example, in FIG. 6, action 59, the string "zom" is excluded from storage in the Dictionary, but the longest matching string in the Dictionary, "z", is transmitted by the compressed code 274. Thus, the string "zom", even though excluded from storage, benefits from the compression achieved by the string "zo". The compression of the string "zo" was achieved at action 34 when it was stored in the Dictionary at the code 274.

Figure 7:
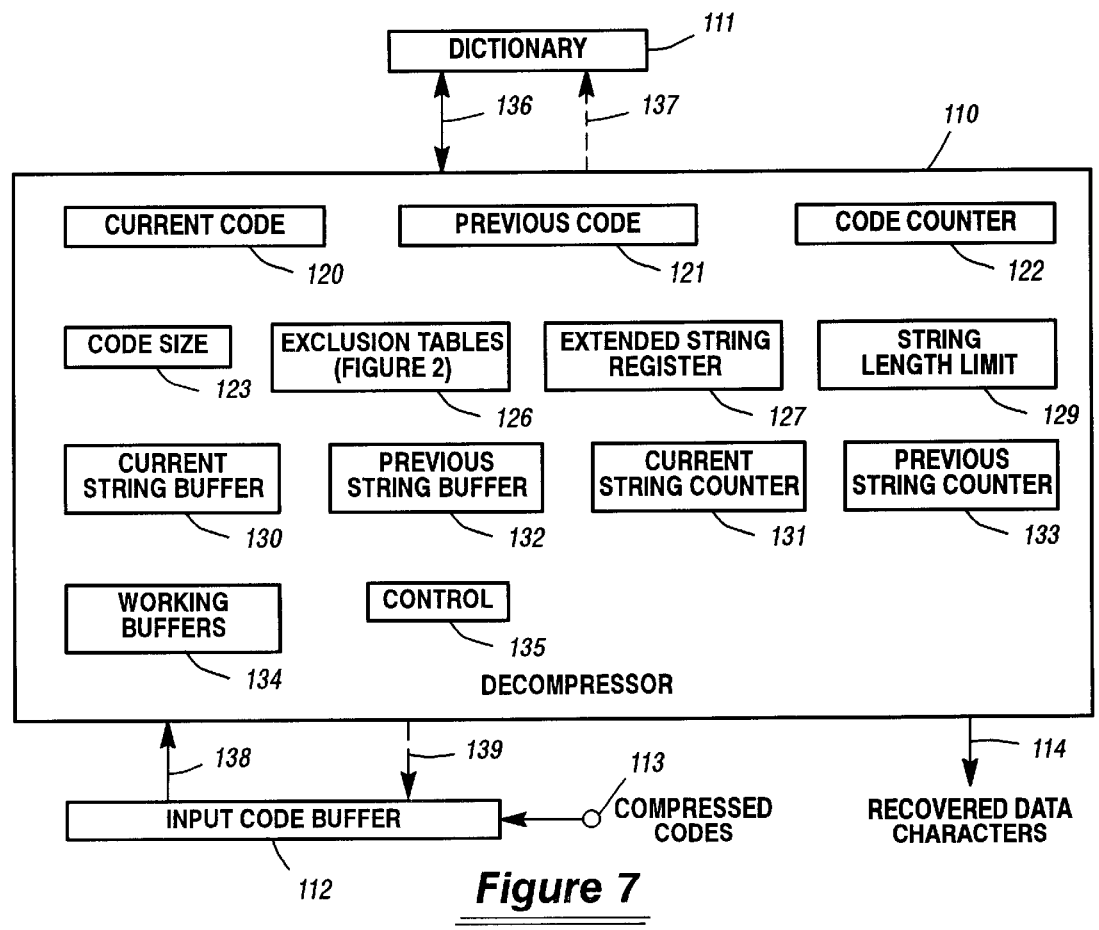
FIG. 7 is a schematic block diagram of a data decompressor embodied in accordance with the present invention for recovering data compressed by the compressor of FIG. 1.

Referring to FIG. 7, with continued reference to FIG. 1, a data decompressor 110, together with a Dictionary 111 and an Input Code Buffer 112, decompresses a stream of compressed codes applied at an input 113 into a recovered stream of data characters at an output 114. It is appreciated that the compressed code stream from the output 14 of the compressor 10 (FIG. 1), if applied to the input 113 of the decompressor 110, results in the recovery, at the output 114 of the decompressor 110, of the original input data character stream applied to the input 13 of the compressor 10.

The decompressor 110 includes a Current Code register 120, a Previous Code register 121, a Code Counter 122 and a Code Size register 123. The Code Size register 123 performs a similar function to that described above with respect to the Code Size register 23 of the compressor 10 in that the Code Size register 123 determines the number of bits in which the decompressor 110 receives the input compressed codes. The Code Counter 122 sequentially generates code values to be assigned to extended strings stored in the Dictionary 111 by the decompressor 110 and used to process incoming compressed codes in a manner to be described. It is appreciated from the descriptions below that the Code Counter 122 maintains a lock-step relationship with the Code Counter 22 of the compressor 10 of FIG. 1.

The decompressor 110 further includes Exclusion Tables 126 for storing data character strings to be excluded from storage in the Dictionary 111. The Exclusion Tables 126 are identical to the Exclusion Tables 26 of the compressor 10 and details thereof are described with respect to FIG. 2. After the Exclusion Tables 26 are generated, as described above, the Tables may be transmitted to the decompressor 110 via the network over which the compressor 10 and decompressor 110 are communicating. The Tables 40–43 discussed above with respect to FIG. 2, are denoted as Tables 140–143 with respect to the Exclusion Tables 126 of the decompressor 110.

Also included in the decompressor 110 is an Extended String register 127 for assembling an extended string. The Extended String register 127 is utilized to facilitate determining if the extended string is in the Exclusion Tables 126 in a manner similar to that described above with respect to the Test register 27 of the compressor 10. The decompressor 110 further includes a String Length Limit register 129 for storing a string length limit parameter indicating the maximum length string to be stored in the Dictionary 111. The String Length Limit register 129 is utilized in the decompressor 110 in the manner described above with respect to the String Length Limit register 29 of the compressor 10. The above descriptions with respect to the optional string length limitation feature of the compressor 10 also apply to the string length limitation feature as utilized with the decompressor 110 in a manner to be further described.

The decompressor 110 also includes a Current String Buffer 130 and a Current String Counter 131. The Current String Buffer 130 holds the characters of the string corresponding to Current Code and the Current String Counter 131 provides a count of the number of characters in the string corresponding to Current Code.

Additionally, the decompressor 110 includes a Previous String Buffer 132 and a Previous String Counter 133. At the end of a cycle, in accordance with the descriptions below, the contents of the Current String Buffer 130 and the Current String Counter 131 are, when appropriate, transferred to the Previous String Buffer 132 and the Previous String Counter 133, respectively, so that previous string information is available in the next cycle.

The decompressor 110 further includes Working Buffers 134 for assembling strings for processing and outputting in a manner to be described. Also included is control 135 for controlling the operations of the decompressor 110 in accordance with the operational flow charts of FIGS. 8–11.

The Dictionary 111, in cooperation with the decompressor 110, stores data character strings corresponding to received compressed code inputs. The Dictionary 111 is configured and utilized for string storage and searching generally in the manner of the Dictionary 11 described above (e.g., see said U.S. Pat. Nos. 4,558,302; 5,838,264 or 5,861,827). Data is communicated between the decompressor 110 and the Dictionary 111 via a bi-directional data bus 136 under control of a control bus 35. In the operation of the decompressor 110, the contents of the Dictionary 111 are maintained identical to the contents of the Dictionary 11 of the compressor 10 of FIG. 1.

The Input Code Buffer 112 buffers the input compressed codes received at the input 113. The individual input codes are applied from the Input Code Buffer 112, via a bus 138, to the Current Code register 120 in accordance with operations to be described. The decompressor 110 controls acquiring input codes from the Input Code Buffer 112 via a control bus 139.

Briefly, the operation of the decompressor 110 is as follows. The decompressor 110 is initialized by first fetching and outputting the initial input code. By the operation of the compressor 10 described above, it is appreciated that the initial input code represents a single character and the Exclusion Tables 126 are consulted to determine if the character is included therein. If so, at least the next input code will again represent a single character. Accordingly, input codes are fetched and the characters represented thereby are outputted. The first such code representing a character not in the Exclusion Tables 126 is set into the Previous Code register 121. The code fetching to the Current Code register 120 utilizes the number of bits determined by the Code Size in Code Size register 123.

After initialization, a code is fetched to the Current Code register 120 again utilizing the number of bits determined by the Code Size. The fetched code is examined to determine if it is equal to a character value, greater than the character values but less than the code in the Code Counter 122, or not less than the code in the Code Counter 122.

If the Current Code is greater than the character values and less than the code in the Code Counter 122, the Current Code represents a multiple character string contained in the Dictionary 111. The characters of the string corresponding to Current Code are recovered and output. The string corresponding to Previous Code is concatenated with the first character of the string corresponding to Current Code to form an extended string. If the extended string length is not greater than the string length limit and the extended string is not in the Exclusion Tables 126, the extended string is stored in the Dictionary 111 at the code assigned by the Code Counter 122. The Code Counter 122 is then incremented. If the extended string length exceeds the string length limit or the extended string is included in the Exclusion Tables 126, the extended string is not stored and the Code Counter 122 is not incremented.

If the fetched Current Code is not less than the code in the Code Counter 122, the fetched Current Code represents a string that is stored in the Dictionary 11 (FIG. 1) but is not yet stored in the Dictionary 111. It is appreciated that in the decompressor embodiment described herein, the fetched Current Code will be equal to the Code Counter 122. When this occurs, exception case processing similar to that described in said U.S. Pat. No. 4,558,302 is utilized. Briefly, the string corresponding to Previous Code is extended by the first character thereof and the characters of the extended string are output. The extended string is stored in the Dictionary 111 at the code assigned by the Code Counter 122. This extended string that is output and stored is the string corresponding to Current Code. The Code Counter 122 is then incremented.

If the input Current Code is equal to a character value, the character is outputted. An extended string is formed by concatenating the string corresponding to Previous Code with the character corresponding to Current Code. If the extended string length does not exceed the string length limit and the extended string is not in the Exclusion Tables 126, the extended string is stored in the Dictionary 111 at the code assigned by the Code Counter 122. The Code Counter 122 is then incremented. If the length of the extended string exceeds the string length limit or if the extended string is included in the Exclusion Tables 126, the extended string is not stored in the Dictionary 111 and the Code Counter 122 is not incremented. The Exclusion Tables 126 are then consulted to determine if the character corresponding to Current Code is included therein. If not, processing proceeds in a normal manner by setting Previous Code to Current Code and fetching the next input code to Current Code.

If the character corresponding to Current Code is in the Exclusion Tables 126, the decompressor 110 is re-initialized in a manner similar to that described above by fetching and outputting consecutive input codes that represent single characters which are included in the Exclusion Tables 126. When a code is fetched that represents a single character string that is not in the Exclusion Tables or that represents a multiple character string, the string corresponding to this fetched Current Code is utilized to re-initialize the decompressor 110. The string character or characters are outputted and Previous Code is set to the Current Code.

The control flow charts of FIGS. 8–11 illustrate the detailed operations to be executed by the decompressor 110. The control 135 is considered as containing appropriate circuitry such as state machines, or appropriate software, to control execution of the operations.

Figure 8:
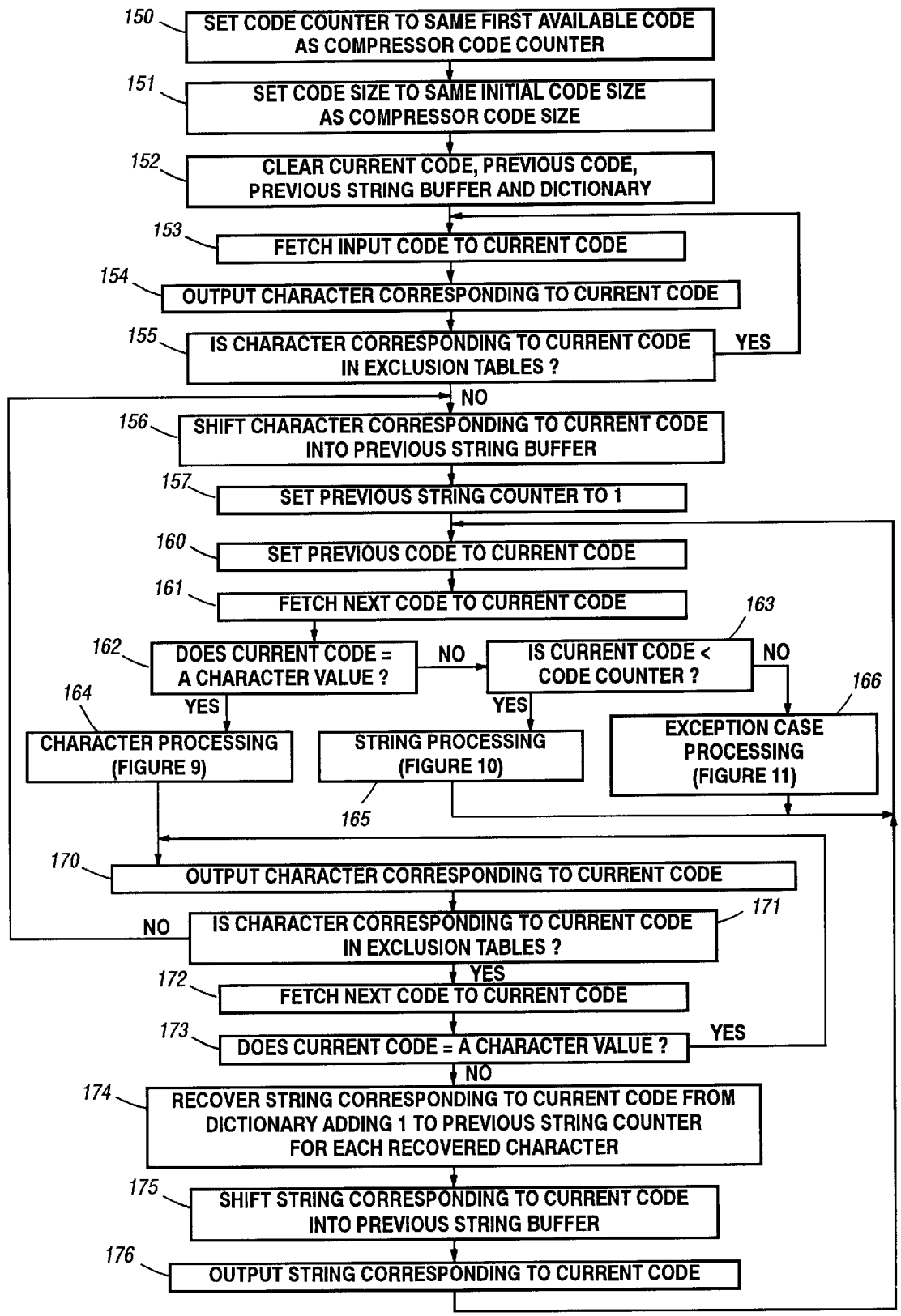
FIG. 8 is a control flow chart illustrating the operations executed by the decompressor of FIG. 7 so as to perform data decompression in accordance with the present invention.

Referring to FIG. 8, with continued reference to FIGS. 2 and 7, at a block 150 the Code Counter 122 is initialized in the manner described above with respect to the block 70 of FIG. 4. At a block 151, the Code Size register 123 is initialized to the beginning Code Size as explained above with respect to the block 71 of FIG. 4. At a block 152, the Current Code register 120, the Previous Code register 121, the Previous String Buffer 132 and the Dictionary 111 are cleared.

At a block 153, an input compressed code is fetched to the Current Code register 120 utilizing the number of bits determined by Code Size. If control enters block 153 from block 152, the code that is fetched will be the first input code. Because of the above described operations of the compressor 10, the first fetched code is a single character. Accordingly, at a block 154, the character corresponding to the fetched Current Code is provided at the decompressor output 114.

At a block 155, the Exclusion Tables 126 are consulted to determine if the single character string corresponding to Current Code is included therein. Since the string is a single character, the Table 140 of single characters is accessed. If Current Code corresponds to an excluded character, the YES branch from the block 155 returns to the block 153 to fetch the next input compressed code to the Current Code register 120. The loop comprising the blocks 153–155 is executed until an input code is fetched that represents a single character string not included in the Exclusion Tables 126. When this occurs, the NO branch from the block 155 is taken to a block 156.

It is appreciated that the blocks 153–155 initialize the decompressor 110 by fetching the initial input codes until the code representing the first non-excluded string is received. Because of the above described operations of the compressor 10, each such initial input code including this first non-excluded string is a single character. The decompressor 110 utilizes this fetched Current Code to provide a previous string on which to base an extended string for potential storage in a following cycle in a manner to be described.

Accordingly, at the block 156, the character corresponding to the fetched Current Code is shifted into the Previous String Buffer 132 which is utilized to hold the character or characters of the previous string. Correspondingly, at a block 157, the Previous String Counter 133 is set to 1. At a block 160, the Current Code in the Current Code register 120 is set into the Previous Code register 121 and at a block 161, the next input compressed code is fetched to the Current Code register 120.

Blocks 162 and 163 are included to determine the type of processing to be performed in accordance with the fetched Current Code. Accordingly, control proceeds from block 161 to block 162 wherein it is determined if the Current Code is equal to a character value. The function of the block 162 may be performed by determining if the value of Current Code is less than a predetermined value, where the predetermined value is greater than any character value. For example, in known compressor and decompressor arrangements, the character values are in the range from 0 up to a particular value. Several code values greater than the character values are often reserved for control functions.

The code values greater than the control codes are then utilized to represent multiple character strings. The first such available code is the value initially set into the Code Counters. For example, in an ASCII environment, values 0–255 represent the characters, codes 256 and 257 may be utilized as control codes and codes 258–4095 represent multiple character strings. Thus, in the ASCII environment, the test of the block 162 would determine if Current Code was less than 256.

It is appreciated herein that control codes are not considered as included in the compressed code stream since the functions thereof are not germane to the invention. Therefore, the processing described herein is considered as ignoring the presence of control codes.

If, at the block 162, Current Code does not equal a character value, the NO branch from the block 162 is taken to the block 163. If the Current Code is equal to a character value, the YES branch from the block 162 is taken to a block 164 whereat character processing is performed. Details of the character processing of the block 164 are described with respect to FIG. 9.

At the block 163, the Current Code in the Current Code register 120 is compared to the code in the Code Counter 122 to determine if Current Code is less than Code Counter. If, at the block 163, Current Code is less than Code Counter, the code in the Current Code register 120 represents a multiple character string stored in the Dictionary 111. Accordingly, the YES branch from the block 163 is taken to a block 165 to perform string processing. Details of the string processing of the block 165 are described with respect to FIG. 10.

If, at the block 163, the code in the Current Code register 120 is equal to the code in the Code Counter 122, the Current Code represents a string not yet stored in the Dictionary 111. Accordingly, the NO branch from the block 163 is taken to a block 166 whereat exception case processing is performed. Details of the exception case processing of the block 166 are described with respect to FIG. 11.

When the string processing of the block 165 or the exception case processing of the block 166 is concluded, control returns to the block 160 for the next decompression cycle.

If, at the block 162, Current Code is equal to a character value and the character processing of the block 164 is performed, processing continues with a block 170. At the block 170, the character corresponding to Current Code is output by providing the character from the Current Code register 120 to the decompressor output 114.

Processing proceeds to a block 171 whereat the Exclusion Tables 126 are consulted to determine if the character in the Current Code register 120 is included in the Exclusion Tables 126. As discussed above with respect to the block 155, conveniently, the Table 140 of single characters is searched to perform the function of the block 171. If the character corresponding to Current Code is not in the Exclusion Tables 126, the NO branch from the block 171 returns to the block 156.

If, at the block 171, the character corresponding to Current Code is included in the Exclusion Tables 126, the decompressor 110 is re-initialized as discussed above. Accordingly, the YES branch from the block 171 is taken to a block 172 whereat the next input compressed code is fetched to the Current Code register 120. At a block 173, the Current Code is evaluated to determine if it is equal to a character value. Processing such as that described with respect to the block 162 is performed to execute the function of the block 173.

If the code in the Current Code register 120 represents a single character, the YES branch from the block 173 returns to the block 170 to continue the re-initialization process. If, at the block 173, the code in the Current Code register 120 is not equal to a character value but instead represents a multiple character string, the NO branch from the block 173 is taken to continue the decompressor re-initialization process at a block 174.

At this point in the processing, if the NO branch from the block 173 is taken, it is appreciated that the code in the Current Code register 120 represents a multiple character string stored in the Dictionary 111. Because of the processing experienced through the blocks 171–173, the Current Code cannot represent an exception case where the corresponding string is not yet stored in the Dictionary.

Accordingly, at the block 174, the string corresponding to the code in the Current Code register 120 is recovered from the Dictionary 111 utilizing the Working Buffers 134 to hold the recovered characters of the string in the appropriate order. The Previous String Counter 133 is incremented for each recovered character of the string. As discussed herein, the methodologies utilized in recovering a string from a dictionary are well known for implementing the functionality of the block 174 (e.g., see said U.S. Pat. Nos. 4,558, 302; 5,838,264 or 5,861,827). At a block 175, the characters of the string recovered at the block 174 are shifted from the Working Buffers 134 into the Previous String Buffer 132. Thus, a previous string is provided on which to base an extended string for potential storage in a following cycle in a manner to be described. At a block 176, the characters of the recovered string are provided at the decompressor output 114. Control then returns to the block 160 to continue the processing.

It is appreciated from the above that the blocks 171–176 perform the decompressor re-initialization process 5 described above with control returning either from the block 171 to the block 156 or from the block 176 to the block 160 to continue the decompression processing. Re-initialization is performed in the manner described so that the decompressor 110 continues to remain synchronized with the compressor 10.

Figure 9:
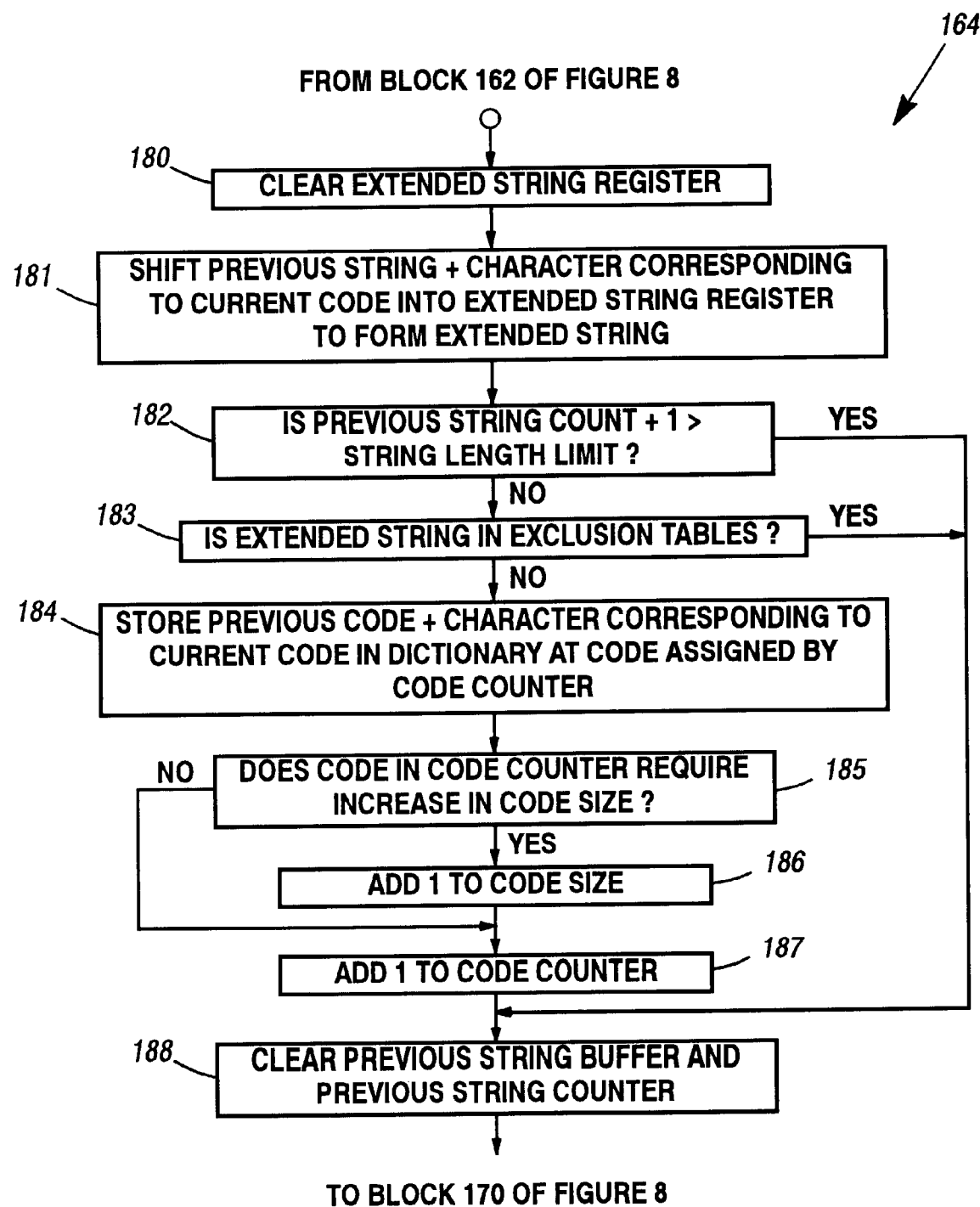
FIG. 9 is a control flow chart illustrating the character processing logic utilized in the flow chart of FIG. 8.

Referring to FIG. 9, with continued reference to FIGS. 2, 7 and 8, details of the character processing block 164 of FIG. 8 are illustrated. Processing proceeds from block 162 of FIG. 8 to a block 180 whereat the Extended String register 127 is cleared.

Processing continues to a block 181 whereat the string corresponding to Previous Code extended by the character corresponding to Current Code is shifted into the Extended String register 127 to form an extended string. Conveniently, the string corresponding to Previous Code is held in the Previous String Buffer 132 and the character corresponding to Current Code is held in the Current Code register 120. The string concatenation function of the block 181 is readily performed by appropriately shifting the contents of the Previous String Buffer 132 and the Current Code register 120 into the Extended String register 127.

Control continues with blocks 182–187 whereat processing is executed similar to that described above with respect to the blocks 86, 87 and 90–93, respectively, of FIG. 4. Briefly, at block 182, a test is performed to determine if the length of the extended string formed at the block 181 exceeds the string length limit stored in the String Length Limit register 129. Since, at the block 181, the extended string is formed by concatenating the previous string with a single character, the quantity (previous string count+1) provides the length of the extended string. The previous string count is derived from the Previous String Counter 133.

At the block 183, the appropriate one of the Tables 140–143 of the Exclusion Tables 126 (FIG. 2) is consulted in accordance with the length of the extended string. The Dictionary update functionality of the block 184 is well known, as explained above, where Previous Code is derived from the Previous Code register 121 and the character corresponding to Current Code is derived from the Current Code register 120.

If the length of the extended string does not exceed the string length limit (block 182) and the extended string is not in the Exclusion Tables 126 (block 183), the extended string is stored in the Dictionary 111 at the code assigned by the Code Counter 122 (block 184) and the Code Counter 122 is incremented (block 187). If, however, at the block 182 or 183, the extended string exceeds the string length limit or the extended string is included in the Exclusion Tables 126, the associated YES branch from the block 182 or 183 is taken to bypass the processing of the blocks 184–187. When this occurs, the extended string is not stored in the Dictionary 111 and the Code Counter 122 is not incremented.

The processing of the blocks 182–187 is performed so that the Dictionary 111 and the Code Counter 122 of the decompressor 110 remain synchronized with the Dictionary 11 and the Code Counter 22 of the compressor 10.

Whether the extended string is stored in or excluded from the Dictionary 111, processing continues at a block 188. At the block 188, the Previous String Buffer 132 and the Previous String Counter 133 are cleared. Processing continues with the block 170 of FIG. 8 discussed above.

Figure 10:
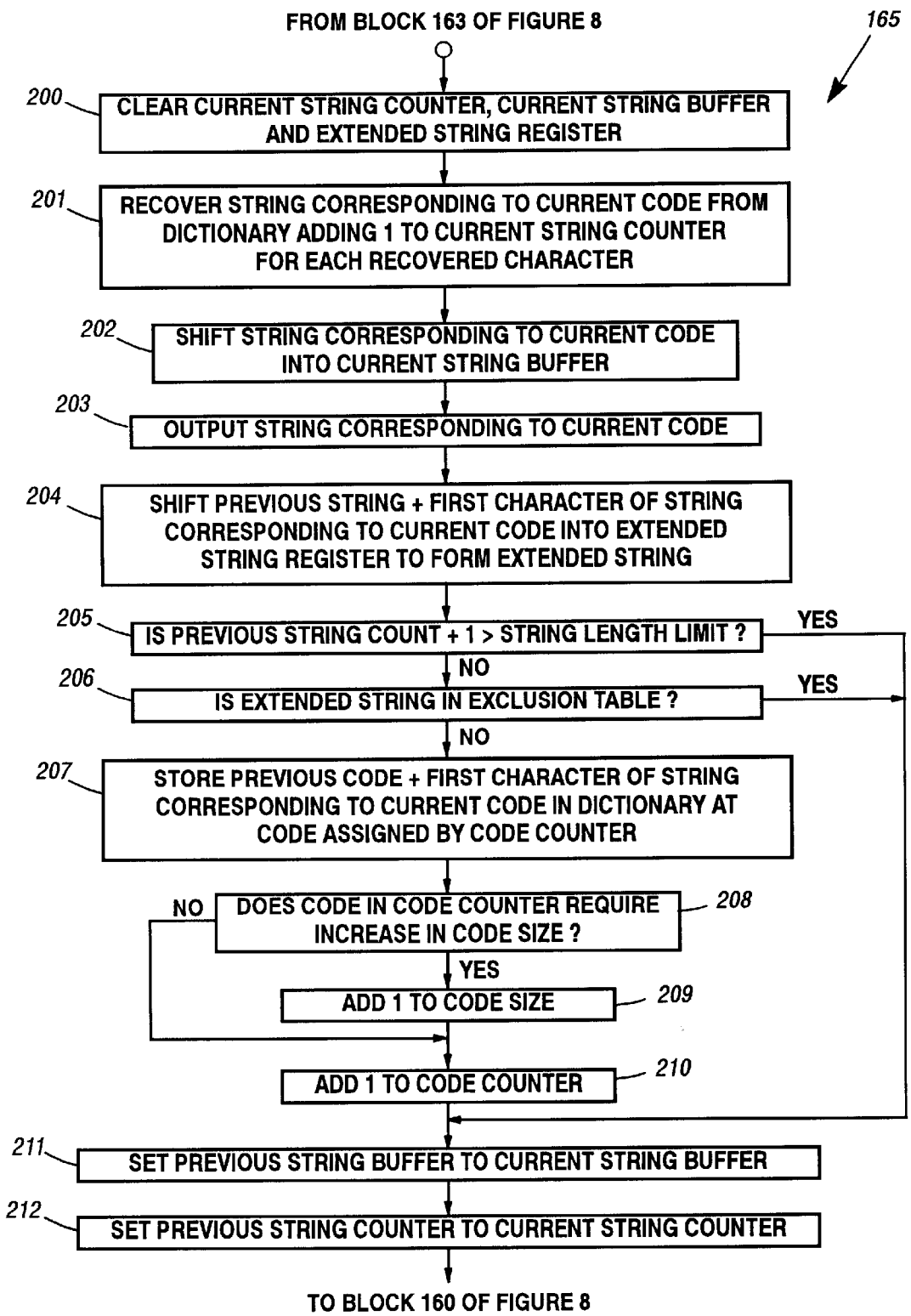
FIG. 10 is a control flow chart illustrating the string processing logic utilized in the flow chart of FIG. 8.

Referring to FIG. 10, with continued reference to FIGS. 2 and 7–9, details of the string processing block 165 of FIG. 8 are illustrated. From the block 163 of FIG. 8, processing enters a block 200 whereat the Current String Counter 131, the Current String Buffer 130 and the Extended String register 127 are cleared.

Processing proceeds to a block 201 whereat the string corresponding to the code in the Current Code register 120 is recovered from the Dictionary 111 utilizing the Working Buffers 134 to hold the recovered characters of the string in the appropriate order. The Current String Counter 131 is incremented for each recovered character of the string. As discussed herein, the methodologies utilized in recovering a string from a dictionary are well known for implementing the functionality of the block 201 (e.g., see said U.S. Pat. Nos. 4,558,302; 5,838,264 or 5,861,827). At a block 202, the characters of the string recovered at the block 201 are shifted from the Working Buffers 134 into the Current String Buffer 130. At a block 203, the characters of the recovered string are provided at the decompressor output 114.

Blocks 204–210 perform similar functions to the respective blocks 181–187 discussed above with respect to FIG. 9 and the descriptions given above with respect to blocks 181–187 generally apply to the blocks 204–210. It is appreciated, however, that at the block 204, the extended string is formed by concatenating the string corresponding to Previous Code with the first character of the string corresponding to Current Code. The extension character is conveniently obtained from the Current String Buffer 130. Furthermore, at the block 207, the extended string that is potentially stored in the Dictionary 111 comprises Previous Code plus the first character of the string corresponding to Current Code.

Processing then enters a block 211 whereat the string held in the Current String Buffer 130 is set into the Previous String Buffer 132. At a block 212, the count in the Current String Counter 131 is set into the Previous String Counter 133. The processing of blocks 211 and 212 are performed to provide previous string information to the decompressor 110 for use in the next decompression cycle. Processing then returns to block 160 of FIG. 8.

Figure 11:
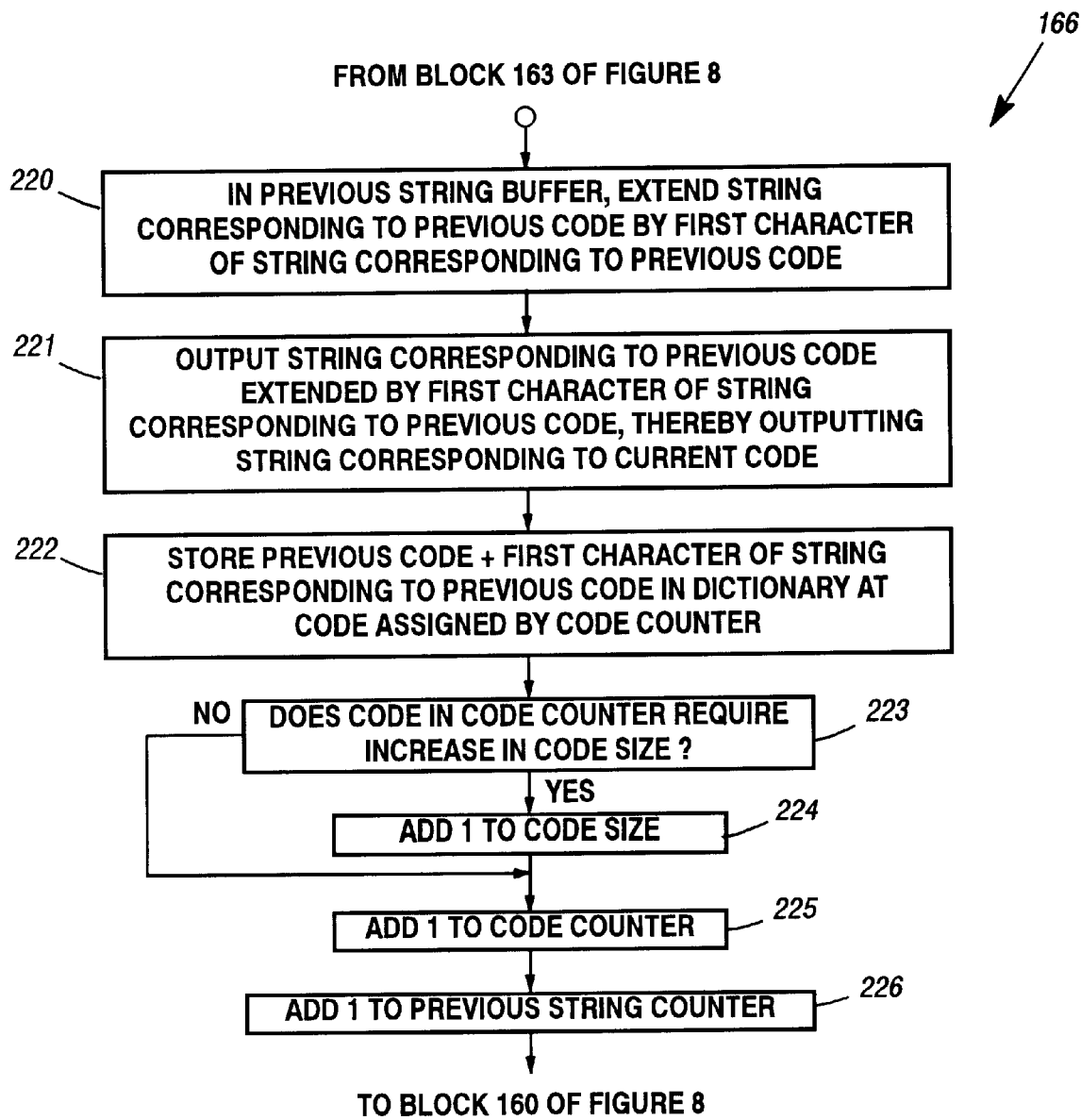
FIG. 11 is a control flow chart illustrating the exception case processing logic utilized in the flow chart of FIG. 8.

Referring to FIG. 11, with continued reference to FIGS. 2 and 7–10, details of the exception case processing of the block 166 of FIG. 8 are illustrated. The exception case processing of block 166 is performed when Current Code is equal to Code Counter. This occurs when Current Code represents a string that has just been stored in the Dictionary 11 and matched by the compressor but is not yet stored in the Dictionary 111 of the decompressor 110. Although exception case processing is well known in the art of LZW data compression and decompression (e.g., see said U.S. Pat. No. 4,558,302), the present implementation conveniently provides previous string information for use in the next decompressor cycle in the preferred embodiments in a manner to be described.

Accordingly, processing proceeds from the block 163 of FIG. 8 to a block 220. At the block 220, the string corresponding to Previous Code is extended by the first character of the string corresponding to Previous Code. This function is conveniently performed in the Previous String Buffer 132 which holds the characters of the string corresponding to Previous Code. It is appreciated that the string as extended and held in the Previous String Buffer 132 is the string corresponding to the Current Code fetched into the Current Code register 120 at the block 161 of FIG. 8. Accordingly, at a block 221, the characters of the string now held in the Previous String Buffer 132 are provided from the Previous String Buffer 132 to the decompressor output 114.

At a block 222, the Dictionary 111 is updated by storing Previous Code from the Previous Code register 121 concatenated by the first character of the string corresponding to Previous Code. The extension character is conveniently provided in the Previous String Buffer 132. This string which, as explained above, corresponds to Current Code is stored in the Dictionary 111 at the code assigned by the Code Counter 122. As previously explained, the processing of FIG. 11 is performed when Current Code is equal to Code Counter.

At blocks 223–225, the Code Counter 122 is incremented in the manner described above with respect to the blocks 91–93 of FIG. 4. 10 Processing proceeds to a block 226 whereat the Previous String Counter 133 is incremented by 1. It is appreciated that by the processing of the block 220, the Previous String Buffer 132 holds the string corresponding to Current Code, which string is one character longer than the string corresponding to Previous Code. Thus, by the processing of the blocks 220 and 226, the Previous String Buffer 132 and the Previous String Counter 133 conveniently provide the appropriate previous string information for the next decompression cycle. Processing then returns to the block 160 of FIG. 8.

It is appreciated from the descriptions given above that when control enters the exception case processing block 166, neither the strings corresponding to Previous Code and to Current Code nor the first character of the string corresponding to Previous Code are in the Exclusion Tables 126. Thus, LZW exception case processing may be performed as described with respect to FIG. 11 without string exclusion.

It is appreciated that aside from the blocks 155–157, 171–176, 180–183, 188, 200–202, 204–206, 211, 212, 220 and 226 (the block 201 as related to the Current String Counter 131) the remainder of FIGS. 8–11 depicts standard LZW data decompression processing. Thus, any known implementation of LZW data decompression can be utilized in implementing the standard LZW data decompression aspects of the present invention.

Referring to FIG. 12, with continued reference to FIGS. 5 and 7–11, an example of the operation of the decompressor 110 in accordance with the flow charts of FIGS. 8–11 is illustrated. The format of FIG. 12 is generally similar to that of FIG. 6 and descriptions given above with respect to FIG. 6 are applicable to FIG. 12. The input compressed code stream at the top of FIG. 12 is the compressor output illustrated in FIG. 6. It is observed that the output of FIG. 12 is the recovered data character stream illustrated at the top of FIG. 6. It is further observed, from the respective Dictionary columns of FIGS. 6 and 12, that the decompressor 110 constructs the contents of the Dictionary 111 to store the same strings at the same codes as the Dictionary 11 of the compressor 10. The Extended String register column of FIG. 12 depicts the string under consideration at an action for storage in the decompressor Dictionary. The operational example of FIG. 12 utilizes the Exclusion Tables of FIG. 5 and the String Length Limit register 129 is set to "3".

In actions 1–6, LZW data decompression is performed on the input compressed code stream with appropriate extended strings being stored in the Dictionary in actions 2, 4 and 6 and with the indicated codes from the Code Counter assigned thereto. Action 6 depicts LZW exception case processing.

Action 7 illustrates the string length limitation exclusion from the Dictionary with respect to the string "abab". It is noted that even though this four character string is not stored, the appropriate recovery of the data characters is effected. The Dictionary exclusion and non-advancement of the Code Counter is effected by the block 182 of FIG. 9 that bypasses the Dictionary Storage and Code Counter incrementation blocks 184–187.

In actions 9–13, compressed codes are received by the decompressor 110 involving strings that are included in the Exclusion Tables or that exceed the string length limit. It is observed that the appropriate strings are excluded from the decompressor Dictionary 111 so as to remain synchronized with the compressor Dictionary 11 with the appropriate data characters being recovered.

In actions 21, 25, 32 and 36, the respective extended strings in the Extended String register are in the Exclusion Tables and thus excluded from storage in the Dictionary. Again, synchronism with the compressor Dictionary is maintained with the appropriate data characters recovered. In actions 36 and 37, it is appreciated that the string exclusion of action 36 results from the block 206 of FIG. 10 bypassing the Dictionary storage and Code Counter incrementation blocks 207–210.

More detailed descriptions of the actions of FIG. 12 relative to the blocks of FIGS. 8–11 are readily apparent and will not be provided for brevity.

With respect to FIGS. 6 and 12, the input data character stream of FIG. 6, the example Exclusion Tables of FIG. 5 and the example string length limit of "3" are not representative of any particular type of data but were chosen to exemplify the detailed operations of the various processing paths of the flow charts of FIGS. 4 and 8–11.

Figure 13A:
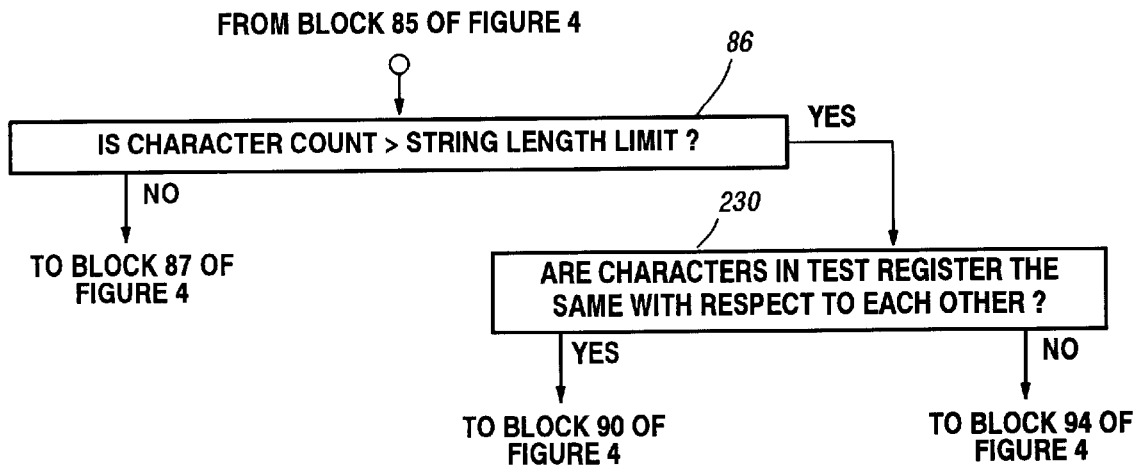
FIGS. 13A and 13B are embodiment modifications to FIGS. 4, 9 and 10 for accommodating input data character runs.

Referring to FIG. 13A, with continued reference to FIGS. 1 and 4, where the same reference numerals indicate the same elements with respect to FIG. 4, a modification to FIG. 4 for accommodating input data character runs is illustrated. As discussed above, strings greater than the string length limit are excluded from compressor Dictionary 11 in order to preserve Dictionary codes for shorter and potentially more useful strings. If, however, a run of the same character is occurring, it may be advantageous to remove the string length limitation from the storage of segments of the run in the Dictionary 11. In this way, the compression capability of LZW with respect to run data will not be impeded.

Accordingly, a block 230 is interposed in the YES branch of the block 86 of FIG. 4. At the block 230, the string in the Test register 27 is examined to determine if the characters thereof are the same with respect to each other. If the characters are the same, it is likely that a data character run is in progress. When this occurs, the YES branch from the block 230 is returned to the block 90 of FIG. 4 for storage of the extended string in the Dictionary 11. When the YES branch of the block 230 is taken, the block 87 of FIG. 4, whereat the Exclusion Tables are consulted, is bypassed. As explained above, the Exclusion Tables in the preferred embodiment do not include strings that are greater than the string length limit.

When, at the block 230, the characters of the string in the Test register 27 are not the same with respect to each other, the NO branch from the block 230 is returned to the block 94 of FIG. 4. When the NO branch from the block 230 is taken, the processing is the same as that described above with respect to FIG. 4.

Figure 13B:
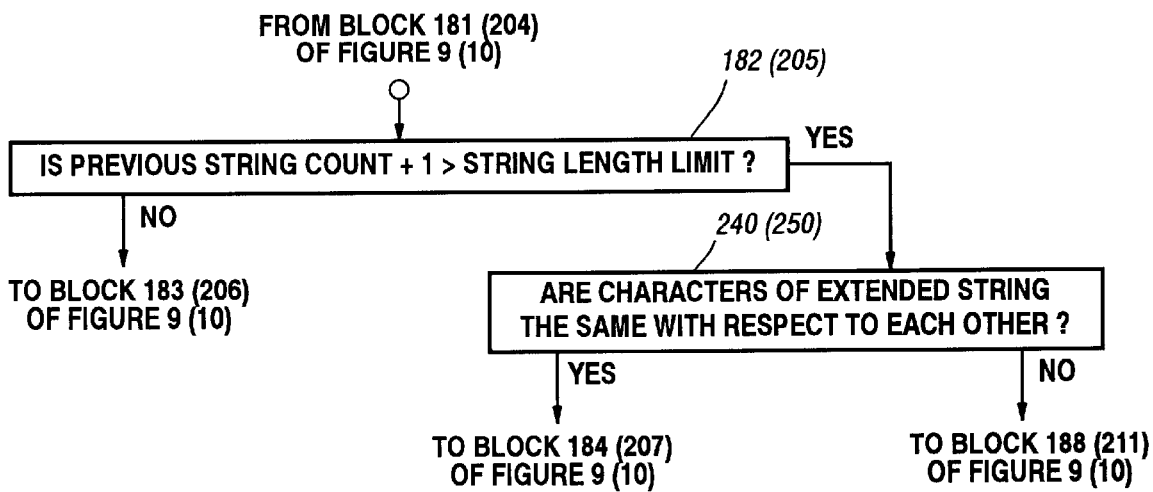

Referring to FIG. 13B, with continued reference to FIGS. 7, 9 and 10, where the same reference numerals indicate the same elements with respect to FIGS. 9 and 10, the decompressor modification counterpart of that of FIG. 13A is illustrated. When the modification of FIG. 13A is utilized in the compressor flow chart of FIG. 4, the modification of FIG. 13B is utilized in the decompressor flow charts of FIGS. 9 and 10 so that the decompressor remains synchronized with the compressor. FIG. 13B depicts the modification to both FIGS. 9 and 10 where the numbers in parentheses refer to the modification to FIG. 10.

In a manner similar to that described above with respect to FIG. 13A, a block 240 (250) is interposed in the YES branch of the block 182 (205). At the block 240 (250), the extended string in the Extended String register 127 is examined to determine if the characters thereof are the same with respect to each other. The process flow and operations are similar to those described above with respect to FIG. 13A and will not be specifically repeated for brevity.

As an alternative to, or extension of, the modifications of FIGS. 13A and 13B, the techniques disclosed in patent application Ser. No. 09/372,483 filed Aug. 12, 1999, may be utilized in the present invention to process runs in the input data character stream.

Although a specific exclusion table structure was described above with respect to FIG. 2, it is appreciated that exclusion table arrangements other than those described above may be utilized in practicing the invention. It is furthermore appreciated from the above descriptions that the decompressor 110 constructs the Dictionary 111 to be identical to the Dictionary 11 of the compressor 10 utilizing only the compressed code stream received from the compressor. It is advantageous that no escape codes are required in practicing the present invention.

In the above embodiments, the input data characters can be over any size alphabet having any corresponding character bit size. For example, the data characters can be textual data, image pixel data or bitmap data. The input data can also be binary characters over the two character binary alphabet 1 and 0 having a onebit size character.

It is appreciated that the above described embodiments of the invention may be implemented in hardware, firmware, software or a combination thereof. Discrete circuit components may readily be implemented for performing the various described functions. In a software embodiment, appropriate modules programmed with coding readily generated from the above described flow charts may be utilized.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. A data compression method for compressing an input stream of data characters into an output stream of compressed codes, comprising:

storing, in storage means, strings of data characters encountered in said input stream, said stored strings having respective codes associated therewith, searching said input stream by comparing said input stream to said stored strings to determine the longest match therewith, outputting the code associated with said longest match so as to provide said output stream of compressed codes, providing an exclusion table structure storing strings of data characters to be excluded from storage in said storage means, forming an extended string comprising said longest match extended by the next data character in said input stream following said longest match, comparing said extended string to said strings of data characters stored in said exclusion table structure to determine if said extended string is included therein, storing said extended string in said storage means and assigning a code corresponding to said stored extended string if said extended string is not included in said exclusion table structure, and bypassing the steps of storing said extended string in said storage means and assigning a code corresponding to said stored extended string if said extended string is included in said exclusion table structure.

2. The compression method of claim 1 wherein said step of providing an exclusion table structure comprises providing a plurality of exclusion tables for storing, respectively, single character strings, two character strings, succeeding length strings, up to strings having a predetermined string length limit, each said exclusion table storing strings having one more character than the strings stored in the preceding exclusion table.

3. The compression method of claim 2 wherein said step of providing an exclusion table structure includes providing said plurality of exclusion tables wherein no prefix of a string stored in an exclusion table is stored as a string in a preceding exclusion table.

4. The compression method of claim 2 further including the step of counting the number of characters of said extended string, and wherein said comparing step includes
 comparing said extended string to the strings stored in the exclusion table that is storing strings having the same number of characters as said extended string.

5. The compression method of claim 2 wherein said searching step comprises comparing said input stream to said stored strings until a mismatching input data character occurs, thereby determining said longest match,
 said method further including,
 determining if said mismatching character is included in said exclusion table for storing single character strings,
 using said mismatching character to begin a next string search for a longest match if said mismatching character is not included in said exclusion table for storing single character strings,
 if said mismatching character is included in said exclusion table for storing single character strings, outputting said mismatching character and fetching and outputting further input data characters until an input data character is fetched that is not included in said exclusion table for storing single character strings, and
 using said fetched input data character that is not included in said exclusion table for storing single character strings to begin a next string search for a longest match.

6. The compression method of claim 2 further including a method for populating said plurality of exclusion tables with data character strings for exclusion from said storage means, comprising:
 providing a body of data characters representative of said input stream of data characters over which compression will be performed,
 establishing a plurality of linked list data trees, one for each character of the alphabet over which compression will be performed, each said data tree beginning with a root node representative of a respective character of said alphabet, each said root node having a counter associated therewith,
 said plurality of data trees including a plurality of chains of linked descendent nodes said chains being linked to said root nodes, each descendent node having a counter associated therewith,
 reading each data character string, up to said string length limit, from said body of data characters into said plurality of data trees, providing a root node and a linked chain of descendent nodes for the respective characters of each said string, incrementing each node counter as the associated character is encountered, and
 selecting a string from said plurality of data trees for populating one of said plurality of exclusion tables when the node counter of the node associated with said string contains a count less than a predetermined threshold.

7. The-compression method of claim 6 further including
 deactivating a node representative of a string selected for inclusion in an exclusion table, and
 further deactivating all nodes descendent from said node representative of said string selected for inclusion in an exclusion table,
 said deactivated nodes being deactivated from further selection of strings for inclusion in said exclusion tables.

8. The compression method of claim 7 wherein said data trees are arranged in levels with said root nodes on a first level, descendent nodes of said root nodes on a second level with succeeding descendent nodes on respective succeeding levels up to a level corresponding to said string length limit,
 selecting the strings for populating said exclusion table of single character strings from the nodes of said first level, selecting the strings for populating said exclusion table of two character strings from the nodes of said second level, selecting the strings for populating said exclusion tables of succeeding length strings from nodes on said respective succeeding levels and selecting strings for populating said exclusion table of strings of said string length limit from the nodes of said level corresponding to said string length limit.

9. The compression method of claim 1 further including
 providing a string length limit,
 counting the number of characters of said extended string, and
 bypassing the steps of storing said extended string in said storage means and assigning a code corresponding to said stored extended string if said number of characters of said extended string exceeds said string length limit.

10. The compression method of claim 9 further including
 determining if the characters of said extended string are the same with respect to each other when the number of characters of said extended string exceeds said string length limit, and
 storing said extended string in said storage means and assigning a code corresponding to said stored extended string if said number of characters of said extended string exceeds said string length limit and said characters of said extended string are the same with respect to each other.

11. The compression method of claim 1 wherein said searching step comprises comparing said input stream to said stored strings until a mismatching input data character occurs, thereby determining said longest match,
 said method further including,
 determining if said mismatching character is included in said exclusion table structure as a single character string,
 using said mismatching character to begin a next string search for a longest match if said mismatching character is not included in said exclusion table structure as a single character string,
 if said mismatching character is included in said exclusion table structure as a single character string, outputting said mismatching character and fetching and outputting further input data characters until an input data character is fetched that is not included in said exclusion table structure as a single character string, and
 using said fetched input data character that is not included in said exclusion table structure as a single character string to begin a next string search for a longest match.

12. A data decompression method for decompressing an input stream of compressed codes into a recovered output stream of data characters corresponding thereto, said decompression method operating in decompression cycles, comprising:
 storing, in storage means, strings of data characters derived from strings corresponding to said compressed codes, said stored strings having respective codes associated therewith,
 fetching an input compressed code in a current decompression cycle, thereby providing a current code,
 outputting the string corresponding to said current code so as to provide said recovered output stream of data characters, providing a previous code corresponding to a code fetched in the decompression cycle prior to said current decompression cycle, providing an exclusion table structure storing strings of data characters to be excluded from storage in said storage means, forming an extended string comprising the string corresponding to said previous code extended by the first data character of said string corresponding to said current code, comparing said extended string to said strings of data characters stored in said exclusion table structure to determine if said extended string is included therein, storing said extended string in said storage means and assigning a code corresponding to said stored extended string if said extended string is not included in said exclusion table structure, bypassing the steps of storing said extended string in said storage means and assigning a code corresponding to said stored extended string if said extended string is included in said exclusion table structure, and setting said previous code to said current code.

13. The decompression method of claim 12 wherein said step of providing an exclusion table structure comprises providing a plurality of exclusion tables for storing, respectively, single character strings, two character strings, succeeding length strings, up to strings having a predetermined string length limit, each said exclusion table storing strings having one more character than the strings stored in the preceding exclusion table.

14. The decompression method of claim 13 wherein said step of providing an exclusion table structure includes providing said plurality of exclusion tables wherein no prefix of a string stored in an exclusion table is stored as a string in a preceding exclusion table.

15. The decompression method of claim 13 further including the step of providing a count of the number of characters of said extended string, and wherein said comparing step includes comparing said extended string to the strings stored in the exclusion table that is storing strings having the same number of characters as said extended string.

16. The decompression method of claim 15 wherein said step of providing a count of the number of characters of said extended string comprises providing a count of the number of characters of the string corresponding to said previous code, and incrementing said count of the number of characters of said string corresponding to said previous code by one thereby providing said count of the number of characters of said extended string.

17. The decompression method of claim 12 wherein said input stream of compressed codes is provided by a data compression method using a compression exclusion table structure storing strings of data characters to be excluded from storage in compression storage means, said step of providing an exclusion table structure comprising providing said exclusion table structure storing strings of data characters identical to said strings of data characters stored in said compression exclusion table structure.

18. The decompression method of claim 12 further including determining if said current code represents a multiple character string stored in said storage means, and said current code represents a multiple character string stored in said storage means, recovering, from said storage means, the characters of said string corresponding to said current code, said outputting step comprising outputting said characters of said string corresponding to said current code so as to provide said recovered output stream of data characters.

19. The decompression method of claim 12 further including determining if said current code represents a single character string, if said current code represents a single character string, said forming step comprises forming an extended string comprising said string corresponding to said previous code extended by the character of said single character string, and said outputting step comprises outputting said character of said single character string so as to provide said recovered output stream of data characters.

20. The decompression method of claim 19 further comprising (a) comparing said single character string to said strings of data characters stored in said exclusion table structure to determine if said single character string is included therein, (b) if said single character string is not included in said exclusion table structure, performing said step of setting said previous code to said current code and proceeding to a next decompression cycle, (c) if said single character string is included in said exclusion table structure, fetching a next input compressed code, (d) if said next fetched input compressed code represents a single character string that is included in said exclusion table structure, outputting the character of sail single character string that is included in said exclusion table structure, fetching a next input compressed code and repeating step (d), (e) if said next fetched input compressed code represents a single character string not included in said exclusion table structure, outputting the character of said single character string that is not included in said exclusion table structure, setting said previous code to said fetched input compressed code representative of said single character string not included in said exclusion table structure, and proceeding to said next decompression cycle, if said next fetched input compressed code represents a multiple character string, said decompression method includes the following steps prior to proceeding to said next decompression cycle, (f) recovering, from said storage means, the characters of said multiple character string, (g) outputting said characters of said multiple character string so as to provide said recovered output stream of data characters, and (h) setting said previous code to said fetched input compressed code representative of said multiple character string.

21. The decompression method of claim 12 further including providing a string length limit, providing a count of the number of characters of said extended string, and bypassing the steps of storing said extended string in said storage means and assigning a code corresponding to said stored extended string if said number of characters of said extended string exceeds said string length limit.

22. The decompression method of claim 21 further including determining if the characters of said extended string are the same with respect to each other when the number of characters of said extended string exceeds said string length limit, and storing said extended string in said storage means and assigning a code corresponding to said stored extended string if said number of characters of said extended string exceeds said string length limit and said characters of said extended string are the same with respect to each other.

23. The decompression method of claim 12 further including determining if said current code represents a multiple character string not stored in said storage means, if said current code represents a multiple character string not stored in said storage means, performing exception case processing by forming an exception case string comprising said string corresponding to said previous code extended by the first data character of said string corresponding to said previous code, storing said exception case string in said storage means, assigning a code corresponding to said stored exception case string, and wherein said outputting step comprises outputting the characters of said exception case string so as to provide said recovered output stream of data characters, said setting step comprises setting said previous code to said current code representing said string not included in said storage means.

24. The decompression method of claim 23 further including a step of providing an exception case string count for use in a next decompression cycle comprising providing a count of the characters of said string corresponding to said previous code, and adding 1 to said count of said characters of said string corresponding to said previous code thereby providing said exception case string count.

25. Data compression apparatus for compressing an input stream of data characters into an output stream of compressed codes, comprising:

storage means for storing strings of data characters encountered in said input stream, said stored strings having respective codes associated therewith, means for searching said input stream by comparing said input stream to said stored strings to determine the longest match therewith, means for outputting the code associated with said longest match so as to provide said output stream of compressed codes, an exclusion table structure for storing strings of data characters to be excluded from storage in said storage means, means for forming an extended string comprising said longest match extended by the next data character in said input stream following said longest match, means for comparing said extended string to said strings of data characters stored in said exclusion table structure to determine if said extended string is included therein, means for storing said extended string in said storage means and assigning a code corresponding to said stored extended string if said extended string is not included in said exclusion table structure, and means for bypassing storing said extended string in said storage means and assigning a code corresponding to said stored extended string if said extended string is included in said exclusion table structure.

26. The compression apparatus of claim 25 wherein said exclusion table structure comprises a plurality of exclusion tables for storing, respectively, single character strings, two character strings, succeeding length strings, up to strings having a predetermined string length limit, each said exclusion table storing strings having one more character than the strings stored in the preceding exclusion table.

27. The compression apparatus of claim 26 wherein said plurality of exclusion tables are arranged so that no prefix of a string stored in an exclusion table is stored as a string in a preceding exclusion table.

28. The compression apparatus of claim 26 further including means for counting the number of characters of said extended string, and wherein said comparing means includes means for comparing said extended string to the strings stored in the exclusion table that is storing strings having the same number of characters as said extended string.

29. The compression apparatus of claim 26 wherein said searching means comprises means for comparing said input stream to said stored strings until a mismatching input data character occurs, thereby determining said longest match, said apparatus further including, means for determining if said mismatching character is included in said exclusion table for storing single character strings, means for using said mismatching character to begin a next string search for a longest match if said mismatching character is not included in said exclusion table for storing single character strings, means operative, if said mismatching character is included in said exclusion table for storing single character strings, for outputting said mismatching character and fetching and outputting further input data characters until an input data character is fetched that is not included in said exclusion table for storing single character strings, and means for using said fetched input data character that is not included in said exclusion table for storing single character strings to begin a next string search for a longest match.

30. The compression apparatus of claim 25 further including means for providing a string length limit, means for counting the number of characters of said extended string, and means for bypassing storing said extended string in said storage means and assigning a code corresponding to said stored extended string if said number of characters of said extended string exceeds said string length limit.

31. The compression apparatus of claim 30 further including means for determining if the characters of said extended string are the same with respect to each other when the number of characters of said extended string exceeds said string length limit, and means for storing said extended string in said storage means and assigning a code corresponding to said stored extended string if said number of characters of said extended string exceeds said string length limit and said characters of said extended string are the same with respect to each other.

32. The compression apparatus of claim 25 wherein said searching means comprises means for comparing said input stream to said stored strings until a mismatching input data character occurs, thereby determining said longest match, said apparatus further including, means for determining if said mismatching character is included in said exclusion table structure as a single character string, means for using said mismatching character to begin a next string search for a longest match if said mismatching character is not included in said exclusion table structure as a single character string, means operative, if said mismatching character is included in said exclusion table structure as a single character string, for outputting said mismatching character and fetching and outputting further input data characters until an input data character is fetched that is not included in said exclusion table structure as a single character string, and means for using said fetched input data character that is not included in said exclusion table structure as a single character string to begin a next string search for a longest match.

33. The compression apparatus of claim 25 wherein said means for assigning a code corresponding to said stored extended string comprises a code counter.

34. Data decompression apparatus for decompressing an input stream of compressed codes into a recovered output stream of data characters corresponding thereto, said decompression apparatus operating in decompression cycles, comprising:

storage means for storing strings of data characters derived from strings corresponding to said compressed codes, said stored strings having respective codes associated therewith, means for fetching an input compressed code in a current decompression cycle, thereby providing a current code, means for outputting the string corresponding to said current code so as to provide said recovered output stream of data characters, a previous code register for providing a previous code corresponding to a code fetched in the decompression cycle prior to said current decompression cycle, an exclusion table structure for storing strings of data characters to be excluded from storage in said storage means, means for forming an extended string comprising the string corresponding to said previous code extended by the first data character of said string corresponding to said current code, means for comparing said extended string to said strings of data characters stored in said exclusion table structure to determine if said extended string is included therein, means for storing said extended string in said storage means and assigning a code corresponding to said stored extended string if said extended string is not included in said exclusion table structure, means for bypassing storing said extended string in said storage means and assigning a code corresponding to said stored extended string if said extended string is included in said exclusion table structure, and means for setting said previous code to said current code.

35. The decompression apparatus of claim 34 wherein said exclusion table structure comprises a plurality of exclusion tables for storing, respectively, single character strings, two character strings, succeeding length strings, up to strings having a predetermined string length limit, each said exclusion table storing strings having one more character than the strings stored in the preceding exclusion table.

36. The decompression apparatus of claim 35 further including means for providing a count of the number of characters of said extended string, and wherein said comparing means includes means for comparing said extended string to the strings stored in the exclusion table that is storing strings having the same number of characters as said extended string.

37. The decompression apparatus of claim 36 wherein said means for providing a count of the number of characters of said extended string comprises means for providing a count of the number of characters of the string corresponding to said previous code, and means for incrementing said count of the number of characters of said string corresponding to said previous code by one thereby providing said count of the number of characters of said extended string.

38. The decompression apparatus of claim 35 wherein said plurality of exclusion tables are arranged so that no prefix of a string stored in an exclusion table is stored as a string in a preceding exclusion table.

39. The decompression apparatus of claim 34 further including means for determining if said current code represents a multiple character string stored in said storage means, and means operative, if said current code represents a multiple character string stored in said storage means, for recovering, from said storage means, the characters of said string corresponding to said current code, said outputting means comprising means for outputting said characters of said string corresponding to said current code so as to provide said recovered output stream of data characters.

40. The decompression apparatus of claim 34 further including means for determining if said current code represents a single character string, if said current code represents a single character string, said forming means is operative for forming an extended string comprising said string corresponding to said previous code extended by the character of said single character string, and said outputting means is operative for outputting said character of said single character string so as to provide said recovered output stream of data characters.

41. The decompression apparatus of claim 40 further comprising means for comparing said single character string to said strings of data characters stored in said exclusion table structure to determine if said single character string is included therein, said decompression apparatus operative (a) if said single character string is not included in said exclusion table structure, for setting said previous code to said current code and proceeding to a next decompression cycle, (b) if said single character string is included in said exclusion table structure, for fetching a next input compressed code, (c) if said next fetched input compressed code represents a single character string that is included in said exclusion table structure, for outputting the character of said single character string that is included in said exclusion table structure, fetching a next input compressed code and repeating (c), (d) if said next fetched input compressed code represents a single character string not included in said exclusion table structure, for outputting the character of said single character string that is not included in said exclusion table structure, setting said previous code to said fetched input compressed code representative of said single character string not included in said exclusion table structure, and proceeding to said next decompression cycle, if said next fetched input compressed code represents a multiple character string, said decompression apparatus is operative for performing the following prior to proceeding to said next decompression cycle, (e) recovering, from said storage means, the characters of said multiple character string, (f) outputting said characters of said multiple character string so as to provide said recovered output stream of data characters, and (g) setting said previous code to said fetched input compressed code representative of said multiple character string.

42. The decompression apparatus of claim 34 further including means for providing a string length limit, means for providing a count of the number of characters of said extended string, and means for bypassing storing said extended string in said storage means and assigning a code corresponding to said stored extended string if said number of characters of said extended string exceeds said string length limit.

43. The decompression apparatus of claim 42 further including means for determining if the characters of said extended string are the same with respect to each other when the number of characters of said extended string exceeds said string length limit, and means for storing said extended string in said storage means and assigning a code corresponding to said stored extended string if said number of characters of said extended string exceeds said string length limit and said characters of said extended string are the same with respect to each other.

44. The decompression apparatus of claim 34 further including means for determining if said current code represents a multiple character string not stored in said storage means, and means operative, if said current code represents a multiple character string not stored in said storage means, for performing exception case processing by forming an exception case string comprising said string corresponding to said previous code extended by the first data character of said string corresponding to said previous code, storing said exception case string in said storage means, and assigning a code corresponding to said stored exception case string, said outputting means comprising means for outputting the characters of said exception case string so as to provide said recovered output stream of data characters, said setting means comprising means for setting said previous code to said current code representing said string not included in said storage means.

45. The decompression apparatus of claim 44 further including means for providing an exception case string count for use in a next decompression cycle comprising means for providing a count of the characters of said string corresponding to said previous code, and means for adding 1 to said count of said characters of said string corresponding to said previous code thereby providing said exception case string count.

46. The decompression apparatus of claim 34 wherein said means for assigning a code corresponding to said stored extended string comprises a code counter.

47. The decompression apparatus of claim 34 wherein said input stream of compressed codes is provided by a data compressor having a compressor exclusion table structure storing strings of data characters to be excluded from storage in compression storage means, and said decompression apparatus is operative so that said exclusion table structure of said decompression apparatus stores strings of data characters identical to said strings of data characters stored in said compression exclusion table structure.

* * * * *